US012727310B2

(12) United States Patent
Park et al.

(10) Patent No.: US 12,727,310 B2
(45) Date of Patent: Sep. 1, 2026

(54) DISPLAY DEVICE

(71) Applicant: Samsung Display Co., LTD., Yongin-si (KR)

(72) Inventors: Do Yeong Park, Hwaseong-si (KR); Kyung Bae Kim, Seongnam-si (KR); Sung Chul Hong, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 677 days.

(21) Appl. No.: 17/567,769

(22) Filed: Jan. 3, 2022

(65) Prior Publication Data

US 2022/0216264 A1 Jul. 7, 2022

(30) Foreign Application Priority Data

Jan. 4, 2021 (KR) ........................ 10-2021-0000292

(51) Int. Cl.

| | |
|---|---|
| ***H10H 29/80*** | (2025.01) |
| ***H10H 20/821*** | (2025.01) |
| ***H10H 20/831*** | (2025.01) |
| ***H10H 20/84*** | (2025.01) |
| ***H10H 20/851*** | (2025.01) |
| ***H10H 20/855*** | (2025.01) |
| ***H10H 29/14*** | (2025.01) |

(52) U.S. Cl.

CPC ........ *H10H 29/142* (2025.01); *H10H 20/821* (2025.01); *H10H 20/831* (2025.01); *H10H 20/84* (2025.01); *H10H 20/851* (2025.01); *H10H 20/855* (2025.01)

(58) Field of Classification Search

CPC ..... H01L 27/156; H01L 33/38; H10H 29/832; H10H 29/8321; H10H 29/142

See application file for complete search history.

(56) References Cited

U.S. PATENT DOCUMENTS

| | | | |
|---|---|---|---|
| 10,818,647 | B2 | 10/2020 | Kim et al. |
| 10,935,828 | B2 | 3/2021 | Jeong et al. |
| 11,487,143 | B2 | 11/2022 | Jeong et al. |

(Continued)

FOREIGN PATENT DOCUMENTS

| | | | |
|---|---|---|---|
| CN | 108267903 | A | 7/2018 |
| CN | 115803870 | A | 3/2023 |

(Continued)

*Primary Examiner* — Michele Fan

(74) *Attorney, Agent, or Firm* — Womble Bond Dickinson (US) LLP

(57) ABSTRACT

A display device includes an emission area and a sub-area spaced from the emission area in a first direction, a plurality of electrodes in the emission area and extending in the first direction, the plurality of electrodes being spaced from each other along a second direction crossing the first direction, a first insulating layer on the plurality of electrodes, and a plurality of light emitting elements on the first insulating layer, both ends of the plurality of light emitting elements being on the plurality of electrodes that are spaced from each other along the second direction, wherein the plurality of electrodes include a first electrode including a first portion and a second portion, the second portion of the first electrode having a width measured in the second direction that is smaller than a width of the first portion measured in the second direction.

14 Claims, 27 Drawing Sheets

(56) References Cited

U.S. PATENT DOCUMENTS

| | | | |
|---|---|---|---|
| 11,934,058 | B2 | 3/2024 | Jeong et al. |
| 12,288,833 | B2 | 4/2025 | Yang et al. |
| 12,382,768 | B2 | 8/2025 | Jeong et al. |
| 12,393,073 | B2 | 8/2025 | Jeong et al. |
| 2014/0367705 | A1 | 12/2014 | Bibl et al. |
| 2018/0188579 | A1* | 7/2018 | Jeong ................ G02F 1/133345 |
| 2018/0323239 | A1 | 11/2018 | Lee et al. |
| 2019/0386070 | A1 | 12/2019 | Lee et al. |
| 2020/0403030 | A1* | 12/2020 | Lee ......................... H01L 33/62 |
| 2021/0013190 | A1 | 1/2021 | Kim et al. |
| 2021/0109624 | A1 | 4/2021 | Lee et al. |
| 2021/0217739 | A1 | 7/2021 | Lee et al. |
| 2021/0265324 | A1 | 8/2021 | Kong et al. |
| 2025/0338687 | A1 | 10/2025 | Jeong et al. |
| 2025/0341742 | A1 | 11/2025 | Jeong et al. |

FOREIGN PATENT DOCUMENTS

| | | | | |
|---|---|---|---|---|
| KR | 2017-0141305 | A | 12/2017 | |
| KR | 10-2018-0007025 | A | 1/2018 | |
| KR | 2018-0009014 | A | 1/2018 | |
| KR | 2018-0011404 | A | 2/2018 | |
| KR | 2018-0079080 | A | 7/2018 | |
| KR | 10-2018-0122542 | A | 11/2018 | |
| KR | 10-2020-0010706 | A | 1/2020 | |
| KR | 2020-0010701 | A | 1/2020 | |
| KR | 10-2020-0027136 | A | 3/2020 | |
| KR | 2020-0034896 | A | 4/2020 | |
| KR | 2020-0129244 | A | 11/2020 | |
| WO | WO-2020111452 | A1 * | 6/2020 | ........... H01L 23/552 |
| WO | WO-2020226276 | A1 * | 11/2020 | ......... H01L 25/0753 |

* cited by examiner

PX
PX1 PX2 PX3
SA1 SA2 SA3
ROP
CTS
CTD
BNL3
RME1
CNE1
CNE2
RME2
RME3
ED
CNE3
CNE4
CNE5
RME4
EMA1 EMA2 EMA3

EMA : EMA1,EMA2,EMA3
SA : SA1,SA2,SA3

DISPLAY DEVICE

CROSS-REFERENCE TO RELATED APPLICATION

This application claims priority to and the benefit of Korean Patent Application No. 10-2021-0000292 filed on Jan. 4, 2021 in the Korean Intellectual Property Office, the contents of which in its entirety are herein incorporated by reference.

BACKGROUND

1. Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a light emitting material and an inorganic light emitting diode using an inorganic material as a light emitting material.

SUMMARY

Aspects and features of embodiments of the present disclosure provide a display device including electrodes facing each other and having an asymmetric structure due to different widths depending on positions.

Aspects and features of embodiments of the present disclosure also provide a display device in which light emitting elements are concentrated on a part of an electrode.

However, aspects and features of embodiments of the present disclosure are not limited to those set forth herein. The above and other aspects and features of embodiments of the present disclosure will become more apparent to one of ordinary skill in the art to which the disclosure pertains by referencing the detailed description of the disclosure given below.

A display device according to one embodiment may include electrodes having different structures so that light emitting elements may be concentrated in a specific location on the electrode. The display device is advantageous in that it is possible to reduce the number of light emitting elements that are arranged in an undesired area and lost during a fabricating process and to secure a space for connecting the light emitting elements spaced apart from each other in a unit area in series.

It should be noted that the effects of the disclosure are not limited to those described above, and other effects of the disclosure will be apparent from the following description.

According to an embodiment of the disclosure, a display device includes an emission area and a sub-area spaced from the emission area in a first direction, a plurality of electrodes in the emission area and extending in the first direction, the plurality of electrodes being spaced from each other along in a second direction crossing the first direction, a first insulating layer on the plurality of electrodes, and a plurality of light emitting elements on the first insulating layer, both ends of the plurality of light emitting elements being on the plurality of electrodes that are spaced from each other along the second direction, wherein the plurality of electrodes includes a first electrode including a first portion and a second portion, the second portion of the first electrode having a width measured in the second direction that is smaller than a width of the first portion measured in the second direction.

The plurality of electrodes may further include a second electrode apart from the first electrode in the second direction, a third electrode between the first electrode and the second electrode, and a fourth electrode spaced from the second electrode in the second direction, the fourth electrode may include a first portion and a second portion, and the first portion of the first electrode and the first portion of the fourth electrode may be arranged side by side in the second direction.

In some embodiments, an inner side of the first portion of the first electrode that is facing the third electrode may be aligned in the first direction with an inner side of the second portion of the first electrode that is facing the third electrode in the first direction.

In the first electrode, an outer side of the first portion of the first electrode may protrude from an outer side of the second portion of the first electrode in the second direction.

A distance between the first electrode and the third electrode may be equal to a distance between the second electrode and the fourth electrode, and a distance between the first portion of the first electrode and the third electrode may be equal to a distance between the second portion of the first electrode and the third electrode.

The second electrode and the third electrode may have the same width as the second portion of the first electrode.

The display device may further include a plurality of first banks overlapping the first electrode and the fourth electrode, and a second bank overlapping the second electrode and the third electrode, wherein a distance between the first banks and the second bank may be greater than a distance between the first electrode and the third electrode.

The second bank may include a plurality of first bank portions and a second bank portion having a width measured in the second direction that is larger than that of the first bank portion, the first bank portion may be located at a portion of the third electrode that is facing the first portion of the first electrode, and the second bank portion may be located at a portion of the third electrode that is facing the second portion of the first electrode.

The plurality of electrodes may further include a second electrode spaced from the first electrode in the second direction, the second electrode including a first portion and a second portion, and both ends of the plurality of light emitting elements may be on the first electrode and the second electrode.

At least a portion of each of the plurality of electrodes may be in the sub-area, and the first insulating layer may include a plurality of contact portions in the sub-area and exposing a part of a top surface of the plurality of electrodes.

The display device may further include a plurality of contact electrodes on the plurality of electrodes and in contact with some of the light emitting elements, wherein the contact electrodes may be in the emission area and the sub-area, and the contact electrodes contact with some of the electrodes through the plurality of contact portions formed in the sub-area.

The first electrode may include a plurality of first portions spaced from each other in the first direction, and the second portion may be located between the plurality of first portions.

The plurality of light emitting elements may include a first light emitting element group having one end on the first portion of the first electrode and a second light emitting element group having one end on other first portion of the first electrode, and wherein the number of the light emitting elements of the first light emitting element group and the second light emitting element group may be greater than the number of the light emitting elements having one end on the second portion of the first electrode.

The display device may further include a color control structure on the light emitting elements, a color filter layer on the color control structure, and a first light blocking member on the color control structure and surrounding the color filter layer, wherein the color filter layer may overlaps the plurality of first portions of the first electrode, and wherein the first light blocking member may include a portion overlapping the second portion of the first electrode.

According to an embodiment of the disclosure, a display device includes a plurality of first banks extending in a first direction, and a second bank extending in the first direction between the plurality of first banks, a plurality of first type electrodes on the plurality of first banks and extending in the first direction, a plurality of second type electrodes on the second bank between the plurality of first type electrodes and spaced from the plurality of first type electrodes in a second direction, and a plurality of light emitting elements on the plurality of first type electrodes and the plurality of second type electrodes, wherein the second bank includes a plurality of first bank portions and a second bank portion, the second bank portion having a width measured in the second direction that is larger than that of the first bank portion.

The first type electrode may include a first portion facing a portion of the second type electrode on the second bank portion, and a second portion facing a portion of the second type electrode on the second bank portion, and wherein the first portion may have a width measured in the second direction that is larger than that of the second portion.

A distance between the first type electrode and the second type electrode may be smaller than a distance between the first bank and the second bank.

In the first type electrode, an inner side of the first portion of the first type electrode facing the second type electrode may be aligned in the first direction to an inner side of the second portion of the first type electrode facing the second type electrode.

The first bank may include a third bank portion spaced from the first bank portion in the second direction, and a fourth bank portion spaced from the second bank portion in the second direction, the fourth bank portion having a width larger than that of the third bank portion, the width of the fourth bank portion being measured in the second direction, and a distance between the first bank portion and the third bank portion may be greater than a distance between the second bank portion and the fourth bank portion.

In the first bank, outer sides of the third bank portion and the fourth bank portion that do not face the second bank may be aligned in the first direction.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
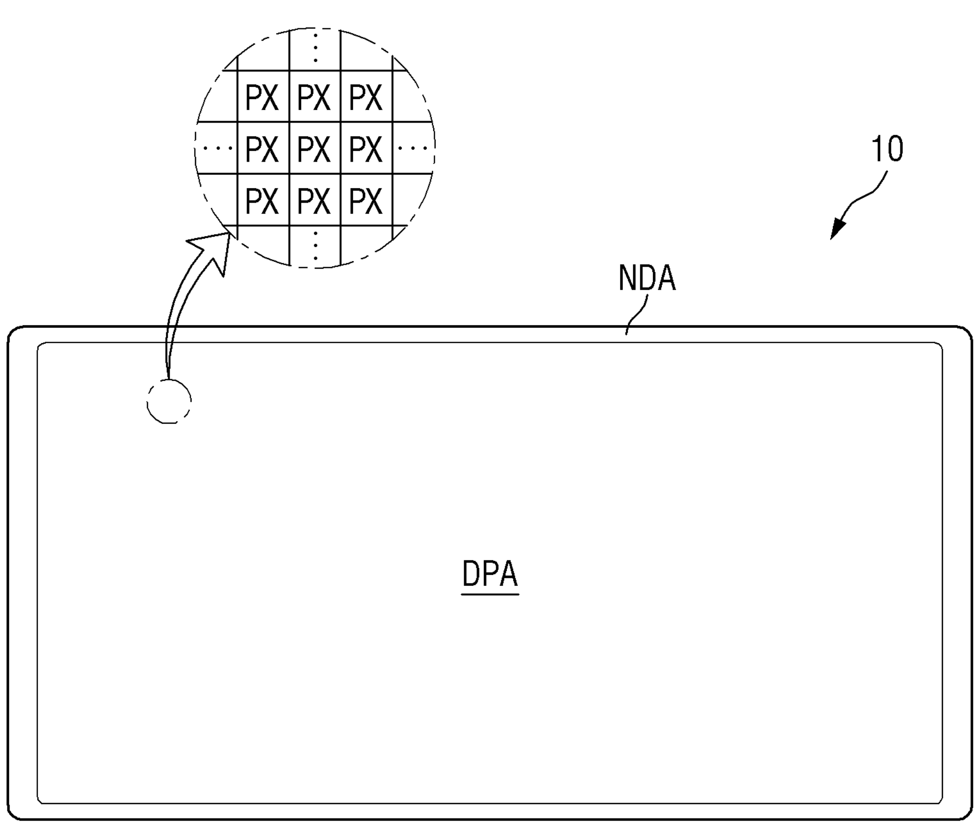
FIG. 1 is a schematic plan view of a display device according to one embodiment.
Figure 1:
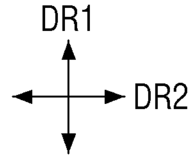

The aspects and features of embodiments of the present disclosure will now be described more fully hereinafter with reference to the accompanying drawings, in which embodiments of the present disclosure are shown. The aspects and features of embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Hereinafter, embodiments of the present disclosure will be described with reference to the accompanying drawings.

FIG. 1 is a schematic plan view of a display device according to one embodiment.

Referring to FIG. 1, a display device 10 displays a moving image and/or a still image. The display device 10 may refer to any electronic device providing a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the present disclosure is not limited thereto, and other display panels may be applied within the same scope of the technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates a display device 10 having a rectangular shape elongated in a second direction DR2.

The display device 10 may include the display area DPA and a non-display area NDA around (e.g., surrounding) the display area DPA along the edge or periphery of the display area DPA. The display area DPA is an area where an image can be displayed, and the non-display area NDA is an area where an image is not displayed. The display area DPA may also be referred to as an active region, and the non-display area NDA may also be referred to as a non-active region. The display area DPA may substantially occupy the center (or a central region) of the display device 10.

The display area DPA may include a plurality of pixels PX. The plurality of pixels PX may be arranged in a matrix. For example, the plurality of pixels may be arranged along rows and columns of a matrix. The shape of each pixel PX may be a rectangular or square shape in a plan view. However, the disclosure is not limited thereto, and it may be a rhombic shape in which each side is inclined with respect to one direction. The pixels PX may be alternately disposed in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be disposed around (e.g., surrounding) the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
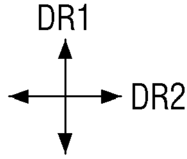
FIG. 2 is a plan view illustrating one pixel of a display device according to one embodiment.

FIG. 2 is a plan view illustrating one pixel of a display device according to one embodiment.

Referring to FIG. 2, each of the plurality of pixels PX of the display device 10 may include a plurality of sub-pixels PXn (n ranging from 1 to 3). For example, one pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be red, the second color may be green, and the third color may be blue. However, the present disclosure is not limited thereto, and the sub-pixels PXn may emit light of the same color. In addition, although FIG. 2 illustrates that one pixel PX includes three sub-pixels PXn, the disclosure is not limited thereto, and the pixel PX may include a larger number of sub-pixels PXn.

Each sub-pixel PXn of the display device 10 may include an emission area EMA and a non-emission area. The emission area EMA may be an area where the light emitting elements ED are aligned or arranged to emit light of a certain wavelength band. The non-emission area may be an area where there is no light emitting element ED and the light emitted from the light emitting elements ED do not reach, so that no light is emitted. The emission area may include an area in which the light emitting element ED is disposed, and an area adjacent to the light emitting element ED to emit light emitted from the light emitting element ED.

Without being limited thereto, the emission area may also include an area in which the light emitted from the light emitting elements ED is reflected or refracted by another member and emitted outside. The plurality of light emitting elements ED may be disposed in each sub-pixel PXn, and the emission area EMA may be formed to include an area where the light emitting elements ED are disposed and an area adjacent thereto.

Although it is illustrated in FIG. 2 that a first emission area EMA1 of the first sub-pixel PX1, a second emission area EMA2 of the second sub-pixel PX2, and a third emission area EMA3 of the third sub-pixel PX3 have a substantially uniform area, the disclosure is not limited thereto. In some embodiments, the emission areas EMA of the sub-pixels PXn may have different sizes according to a color or wavelength band of light emitted from the light emitting element ED disposed in each sub-pixel.

In addition, each sub-pixel PXn may further include a sub-area SA disposed in the non-emission area. The sub-area SA may be disposed at one side of the emission area EMA in the first direction DR1, and may be disposed between the emission areas EMA of the sub-pixels PXn adjacent in the first direction DR1. For example, the emission areas EMA and the sub-areas SA may be repeatedly arranged along the second direction DR2, respectively, while being alternately arranged in the first direction DR1. A third bank BNL3 may be disposed between the sub-area SA and the emission area EMA, and the distance therebetween may vary according to the width of the third bank BNL3. Light may not be emitted from the sub-area SA because the light emitting element ED is not disposed in the sub-area SA. However at least one electrode RME disposed in each sub-pixel PXn may be partially disposed in the sub-area SA. The electrodes RME disposed in some sub-pixels PXn may be separately disposed in the sub-area SA.

The third bank BNL3 may include portions extending in the first direction DR1 and the second direction DR2 in a plan view to be arranged in a grid pattern over the entire surface of the display area DPA. The third bank BNL3 may be disposed along the boundaries between the sub-pixels PXn to delimit (e.g., determine the boundaries of) the neighboring sub-pixels PXn. Further, the third bank BNL3 may be disposed to be around (e.g., surround) the emission area EMA and the sub-area SA disposed for each sub-pixel PXn to delimit them from each other.

Figure 3:
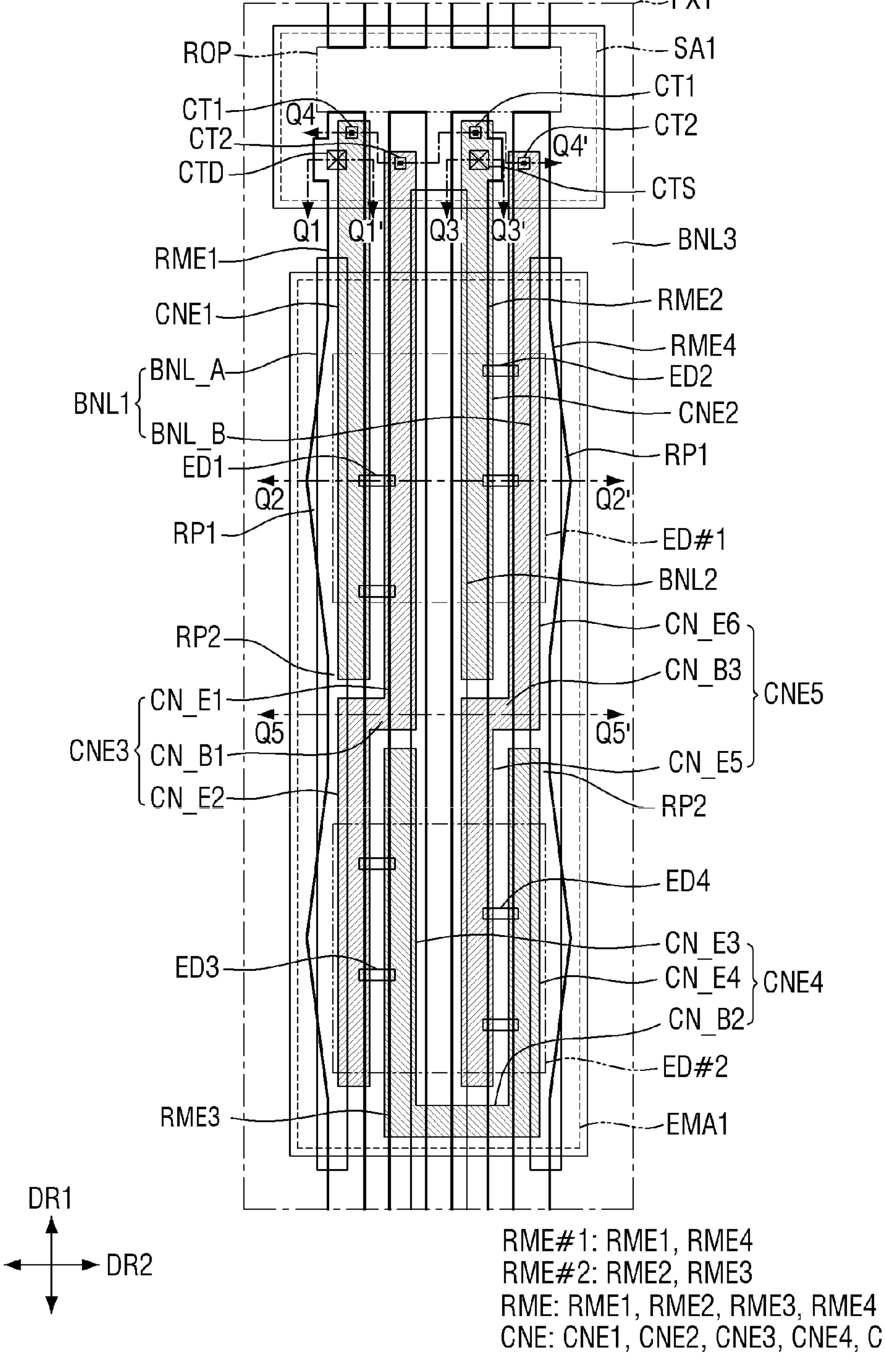
FIG. 3 is a plan view illustrating a first sub-pixel of FIG. 2.
Figure 4:
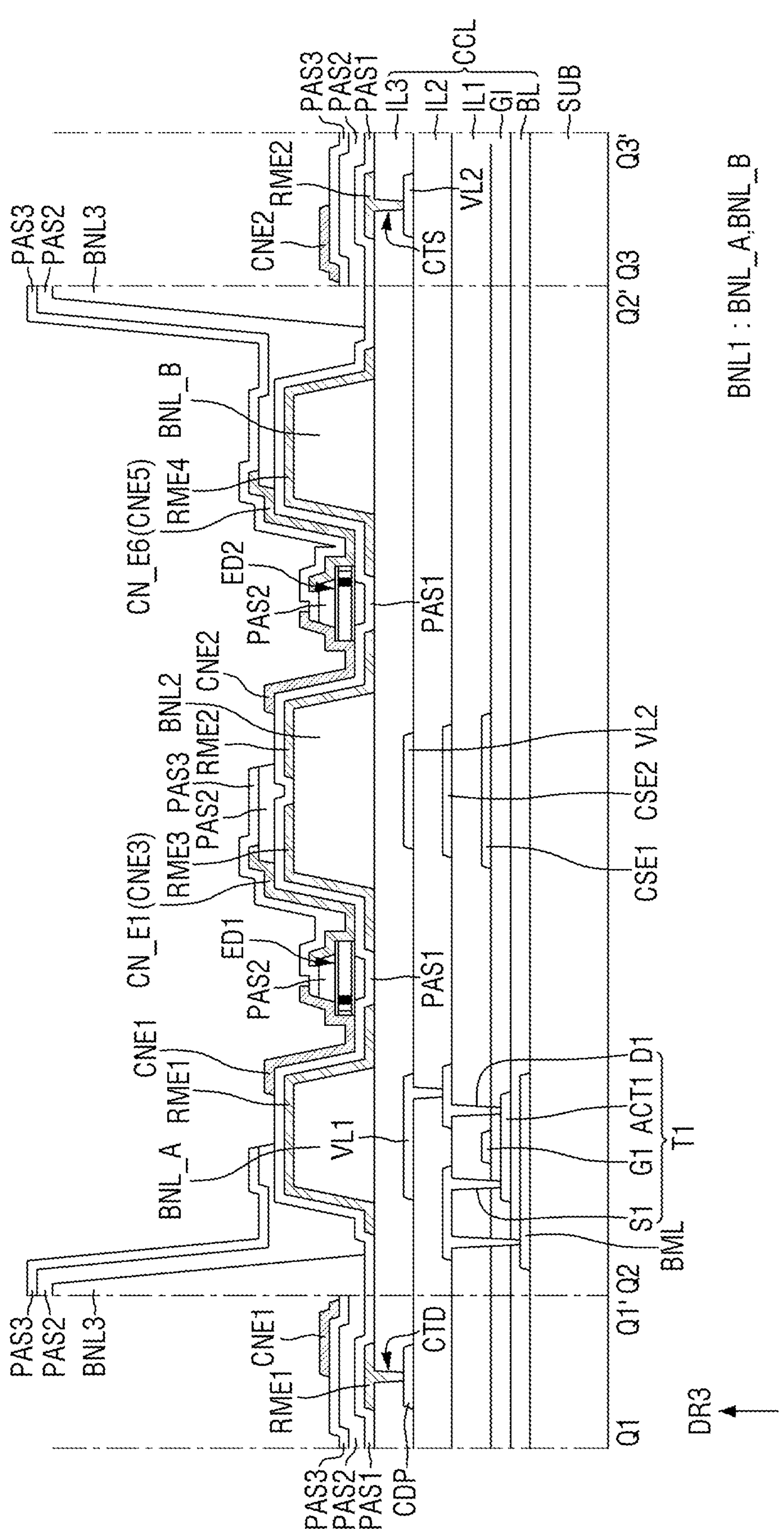
FIG. 4 is a cross-sectional view taken along the lines Q1-Q1', Q2-Q2', and Q3-Q3' of FIG. 3.
Figure 5:
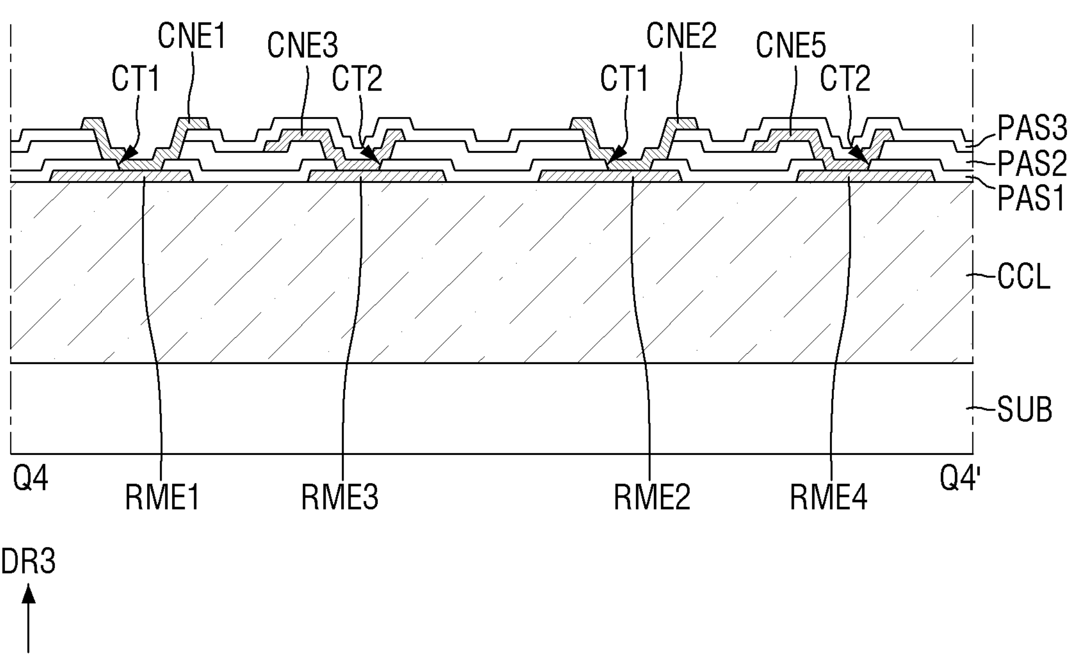
FIG. 5 is a cross-sectional view taken along the line Q4-Q4' of FIG. 3.
Figure 6:
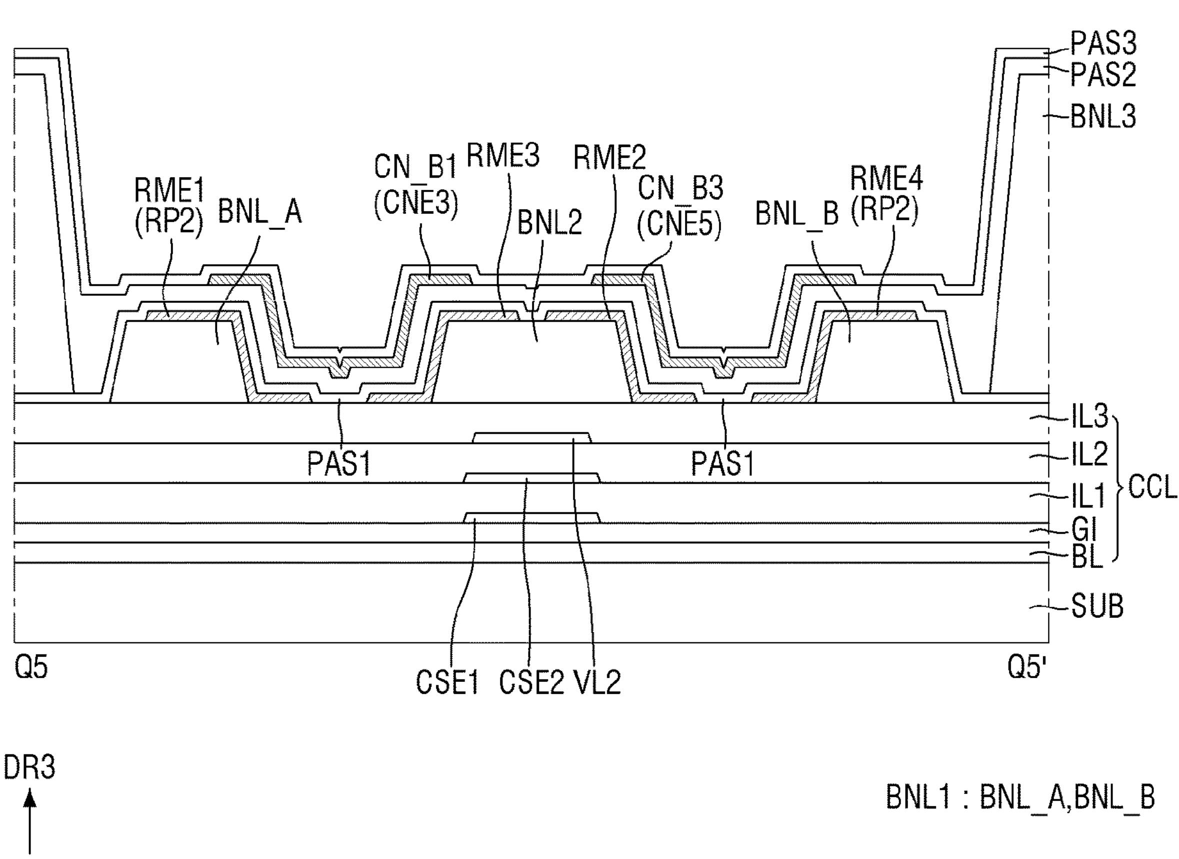
FIG. 6 is a cross-sectional view taken along the line Q5-Q5' of FIG. 3.

FIG. 3 is a plan view illustrating a first sub-pixel of FIG. 2. FIG. 4 is a cross-sectional view taken along the lines Q1-Q1', Q2-Q2', and Q3-Q3' of FIG. 3. FIG. 5 is a cross-sectional view taken along the line Q4-Q4' of FIG. 3. FIG. 6 is a cross-sectional view taken along the line Q5-Q5' of FIG. 3. FIG. 3 illustrates a first sub-pixel PX1 included in one pixel PX of FIG. 2, and FIG. 4 illustrates a cross section across both ends of the light emitting elements ED disposed in one sub-pixel PXn. FIG. 5 illustrates a cross section of contact portions CT1 and CT2 to which the plurality of electrodes RME and a plurality of contact electrodes CNE are connected. FIG. 6 shows a cross section of the area where the light emitting elements ED are not arranged.

Referring to FIGS. 3-6 in conjunction with FIG. 2, the display device 10 may include a first substrate SUB and a semiconductor layer, a plurality of conductive layers, and a plurality of insulating layers disposed on the first substrate SUB. The semiconductor layer, the conductive layers, and the insulating layers may each constitute a circuit layer CCL and a display element layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate that can be bent, folded and/or rolled.

A first conductive layer may be disposed on the first substrate SUB. The first conductive layer includes a lower metal layer BML that is disposed to overlap an active layer ACT1 of a first transistor T1 in a thickness direction of the substrate (e.g., a third direction DR3). The lower metal layer BML may include a material of blocking light to prevent light from reaching the active layer ACT1 of the first transistor T1. However, in some embodiments, the lower metal layer BML may be omitted.

The buffer layer BL may be entirely disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include the active layer ACT1 of the first transistor T1. This may be disposed to partially overlap a gate electrode G1 (of the first transistor T1) of a second conductive layer, which will be described later, in the third direction DR3.

The semiconductor layer may include polycrystalline silicon, monocrystalline silicon, oxide semiconductor, and the like. When the semiconductor layer includes an oxide semiconductor, the active layer ACT1 may include a plurality of conductive regions and a channel region therebetween. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

In another embodiment, the semiconductor layer may include polycrystalline silicon. The polycrystalline silicon may be formed by crystallizing amorphous silicon and, in this case, the conductive region of the active layer ACT1 may be a region doped with impurities.

Although only the first transistor T1 among the transistors included in the sub-pixel PXn of the display device 10 is shown in the drawing, the disclosure is not limited thereto. The display device 10 may include more transistors. For example, the display device 10 may include two or three transistors for each sub-pixel PXn by including one or more transistors in addition to the first transistor T1.

A first gate insulating layer GI is disposed on the semiconductor layer and the buffer layer BL. The first gate insulating layer GI may function as a gate insulating layer of each transistor.

The second conductive layer is disposed on the first gate insulating layer GI. The second gate conductive layer may include the gate electrode G1 of the first transistor T1 and a first capacitance electrode CSE1 of a storage capacitor. The gate electrode G1 may be arranged to overlap the channel region of the active layer ACT1 in the thickness direction of the substrate (e.g., the third direction DR3). The first capacitance electrode CSE1 may be disposed to overlap a second capacitance electrode CSE2 to be described later in the thickness direction of the substrate (e.g., the third direction DR3). In some embodiments, the first capacitance electrode CSE1 may be integrally connected to the gate electrode G1.

A first interlayer insulating layer IL1 is disposed on the second conductive layer and the first gate insulating layer GI. The first interlayer insulating layer IL1 may function as an insulating layer between the second conductive layer and other layers disposed thereon. The first interlayer insulating layer IL1 may be arranged to cover the second conductive layer to protect the second conductive layer.

A third conductive layer is disposed on the first interlayer insulating layer IL1. The third conductive layer may include a first source electrode S1 and a first drain electrode D1 of the first transistor T1, and the second capacitance electrode CSE2.

The first source electrode S1 and the first drain electrode D1 of the first transistor T1 may each contact the doping region of the active layer ACT1 via a contact hole penetrating the first interlayer insulating layer IL1 and the first gate insulating layer GI. The first source electrode S1 of the first transistor T1 may also contact the lower metal layer BML via another contact hole penetrating the first interlayer insulating layer IL1, the first gate insulating layer GI, and the buffer layer BL.

The second capacitance electrode CSE2 is disposed to overlap the first capacitance electrode CSE1 in the thickness direction of the substrate (e.g., the third direction DR3). In one embodiment, the second capacitance electrode CSE2 may be connected integrally with the first source electrode S1. The storage capacitor may be formed between the first capacitance electrode CSE1 and the second capacitance electrode CSE2.

In some embodiments, the third conductive layer may further include a data line for applying a data signal to another transistor. The data line may be connected to the source/drain electrode of another transistor to transmit a signal applied from the data line.

A second interlayer insulating layer IL2 is disposed on the third conductive layer and the first interlayer insulating layer IL1. The second interlayer insulating layer IL2 may function as an insulating layer between the third conductive layer and other layers disposed thereon. Further, the second interlayer insulating layer IL2 may cover the third conductive layer to protect the third conductive layer.

A fourth conductive layer is disposed on the second interlayer insulating layer IL2. The fourth conductive layer may include a first voltage wire VL1, a second voltage wire VL2, and a first conductive pattern CDP. The first voltage wire VL1 may be applied with a high potential voltage (or a first power voltage) supplied to the first transistor T1, and the second voltage wire VL2 may be applied with a low potential voltage (or a second power voltage) supplied to a second electrode RME2.

The first conductive pattern CDP may be connected to the second capacitance electrode CSE2, and may be electrically connected to the first transistor T1 through the second capacitance electrode CSE2. The first conductive pattern CDP may also be in contact with a first electrode RME1, which will be described later, and the first transistor T1 may transfer the first power voltage applied from the first voltage wire VL1 to the first electrode RME1. Although it is illustrated in FIG. 4 that the fourth conductive layer includes one second voltage wire VL2 and one first voltage wire VL1, the present disclosure is not limited thereto. The fourth conductive layer may include a larger number of first voltage wires VL1 and second voltage wires VL2.

The buffer layer BL, the first gate insulating layer GI, the first interlayer insulating layer IL1, and the second interlayer insulating layer IL2 described above may be formed of a plurality of inorganic layers stacked in an alternating manner. For example, the buffer layer BL, the first gate insulating layer GI, the first interlayer insulating layer IL1, and the second interlayer insulating layer IL2 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the present disclosure is not limited thereto, and the buffer layer BL, the first gate insulating layer GI, the first interlayer insulating layer IL1, and the second interlayer insulating layer IL2 may be formed as a single inorganic layer containing the above-described insulating material, or may be made of organic insulating material such as polyimide (P1).

In addition, each of the second conductive layer, the third conductive layer, and the fourth conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

The third interlayer insulating layer IL3 is disposed on the fourth conductive layer and the second interlayer insulating layer IL2. The third interlayer insulating layer IL3 may include an organic insulating material, for example, an organic material such as polyimide (PI), to perform a surface planarization function.

A plurality of first banks BNL1, a second bank BNL2, the plurality of electrodes RME, the light emitting element ED, the plurality of contact electrodes CNE, and the third bank BNL3 are arranged, as the display element layer, on the third interlayer insulating layer IL3. Further, a plurality of insulating layers PAS1, PAS2, and PAS3 may be disposed on the third interlayer insulating layer IL3.

The plurality of first banks BNL1 may be arranged in the emission area EMA of the sub-pixel PXn while being spaced from each other. For example, the first bank BNL1 may include a plurality of sub-banks BNL_A and BNL_B spaced from each other in the second direction DR2 in each emission area EMA. The first sub-bank BNL_A may be located on the left side with respect to the center of the emission area EMA and the second sub-bank BNL_B may be located on the right side with respect to the center of the emission area EMA. The sub-banks BNL_A and BNL_B may have a shape extending in the first direction DR1, and the extension length thereof may be greater than the length of the opening area surrounded by the third bank BNL3 in the first direction DR1. The first banks BNL1 may overlap the portion of the third bank BNL3 extending in the second direction DR2. One first sub-bank BNL_A and one second sub-bank BNL_B may be arranged in one sub-pixel PXn to form an island-shaped pattern extending in one direction with a relatively small width in the entire display area DPA.

The second bank BNL2 may be disposed directly on the third interlayer insulating layer IL3, similarly to the first bank BNL1. The second bank BNL2 may extend in the first direction DR1 between the first sub-bank BNL_A and the second sub-bank BNL_B. In one embodiment, the width of the second bank BNL2 measured in the second direction DR2 may be greater than those of the first banks BNL1, and the extension length of the second bank BNL2 in the first direction DR1 may be greater than those of the first banks BNL1. The extension length of the second bank BNL2 in the first direction DR1 may be greater than the length of the emission area EMA surrounded by the third bank BNL3, and the second bank BNL2 may be partially disposed in the sub-areas SA of the plurality of sub-pixels PXn. One second bank BNL2 may be disposed along the sub-areas SA of different sub-pixels PXn adjacent to each other in the first direction DR1 and the emission area EMA of any one sub-pixel PXn. The second bank BNL2 may be disposed in the plurality of sub-pixels PXn adjacent to each other in the first direction DR1 to form a linear pattern in the entire display area DPA.

The first bank BNL1 and the second bank BNL2 may at least partially protrude with respect to the top surface of the third interlayer insulating layer IL3. The protruding portions of the first bank BNL1 and the second bank BNL2 may have inclined surfaces, and the light emitted from the light emitting element ED may be reflected by the electrode RME disposed on the first bank BNL1 and the second bank BNL2 and emitted in the upward direction of the third interlayer insulating layer IL3. Although the first bank BNL1 and the second bank BNL2 may have linearly inclined side surfaces, the disclosure is not limited thereto, and the first bank BNL1 and the second bank BNL2 may have curved semicircular or semi-elliptical outer surfaces. The first bank BNL1 and the second bank BNL2 may include an organic insulating material such as polyimide (PI), but are not limited thereto. Further, the first bank BNL1 and the second bank BNL2 may be omitted.

The plurality of electrodes RME are disposed for each sub-pixel PXn in a shape extending in one direction. For example, the electrodes RME may have a shape extending in the first direction DR1 and may be disposed to be spaced from each other in the second direction DR2 in each sub-pixel PXn. The electrodes RME of the display device 10 may include electrodes connected directly to the fourth conductive layer under the third interlayer insulating layer IL3 through electrode contact holes CTD and CTS penetrating the third interlayer insulating layer IL3. In some embodiments, the display device 10 may further include electrodes that are not directly connected to the fourth conductive layer.

For example, the electrode RME disposed in one sub-pixel PXn may include the first electrode RME1 and the second electrode RME2 that are directly connected to the fourth conductive layer. Further, the plurality of electrodes RME may further include a third electrode RME3 and a fourth electrode RME4 that are not directly connected to the fourth conductive layer but are electrically connected to the fourth conductive layer through the electrodes and the contact electrodes CNE directly connected to the fourth conductive layer.

The first electrode RME1 may be located on the left side with respect to the center (e.g., the central region) of the emission area EMA. The first electrode RME1 is partially disposed on the first sub-bank BNL_A. The second electrode RME2 may be located on the right side with respect to the center (e.g., the central region) of the emission area EMA while being spaced from the first electrode RME1 in the second direction DR2. The second electrode RME2 is partially disposed on one side of the second bank BNL2 facing the second sub-bank BNL_B.

The third electrode RME3 may be disposed between the first electrode RME1 and the second electrode RME2. The third electrode RME3 may face the first electrode RME1 while being spaced apart from the first electrode RME1, and may be disposed on the second bank BNL2 while being spaced apart from the second electrode RME2. The third electrode RME3 may be partially disposed on the other side of the second bank BNL2 facing the first sub-bank BNL_A. The fourth electrode RME4 may face the second electrode RME2 while being spaced from the second electrode RME2 in the second direction DR2, and may be located on the right side with respect to the center (e.g., the central region) of the emission area EMA. The fourth electrode RME4 may be partially disposed on the second sub-bank BNL_B.

In one embodiment, each of the first electrode RME1 and the second electrode RME2 may be an electrode that is connected to the fourth conductive layer disposed thereunder. For example, the first electrode RME1 may be directly connected to the first conductive pattern CDP of the fourth conductive layer through the first electrode contact hole CTD formed in the sub-area SA and penetrating the third interlayer insulating layer IL3 disposed thereunder. The second electrode RME2 may be directly connected to the second voltage wire VL2 of the fourth conductive layer through the second electrode contact hole CTS formed in the sub-area SA and penetrating the third interlayer insulating layer IL3 disposed thereunder.

The first electrode RME1 may be electrically connected to the first transistor T1 through the first conductive pattern CDP, so that the first power voltage may be applied to the first electrode RME1, and the second electrode RME2 may be electrically connected to the second voltage wire VL2, so that the second power voltage may be applied to the second electrode RME2. The power voltages may be transmitted to the third electrode RME3 and the fourth electrode RME4 through the contact electrode CNE and the light emitting elements ED to be described later. Because the plurality of electrodes RME are disposed for each sub-pixel PXn separately, the light emitting elements ED of different sub-pixels PXn may emit light individually. Although it is illustrated in FIGS. 3-4 that the first electrode contact hole CTD and the second electrode contact hole CTS are formed in the sub-area SA, the disclosure is not limited thereto. For example, each of the electrode contact holes CTD and CTS may be located in the emission area EMA surrounded by the third bank BNL3, or may be formed to overlap the third bank BNL3.

On the other hand, although each of the third electrode RME3 and the fourth electrode RME4 is not directly connected to the fourth conductive layer disposed thereunder, an electrical signal directly applied to a first type electrode (e.g., RME1) may be transmitted thereto through the light emitting element ED or the contact electrode CNE. In other words, although the third electrode RME3 and the fourth electrode RME4 are not directly connected to the fourth conductive layer disposed thereunder, the electric signal applied therefrom may be transmitted, which may cause a non-floating state.

The plurality of electrodes RME may be partially arranged in the sub-area SA of the sub-pixel PXn over the third bank BNL3. The electrodes RME extending in the first direction DR1 may be arranged along the sub-area SA of the corresponding sub-pixel PXn and the sub-area SA of another sub-pixel PXn adjacent thereto in the first direction DR1. The electrodes RME of different sub-pixels PXn may be separately arranged in the sub-area SA. The electrodes RME of different sub-pixels PXn may be spaced from each other with respect to a separation portion ROP disposed in the sub-area SA of any one sub-pixel PXn.

In one embodiment, the width of the plurality of electrodes RME measured in the second direction DR2 may be smaller than the widths of the first bank BNL1 and the second bank BNL2 measured in the second direction DR2. Each of the electrodes RME may be disposed to cover at least one side surface of the first bank BNL1 or the second bank BNL2 to reflect the light emitted from the light emitting element ED. In addition, the distance between the electrodes RME in the second direction DR2 may be smaller than the distance between the first bank BNL1 and the second bank BNL2. Each of the electrodes RME may have at least a portion directly disposed on the third interlayer insulating layer IL3, so that they may be disposed at the same plane.

The electrodes RME may be electrically connected to the light emitting elements ED. The electrodes RME may be connected to both ends of the light emitting element ED through the contact electrodes CNE to be described later, and may transmit an electrical signal applied from the fourth conductive layer to the light emitting element ED. Electrical signals for emitting the light emitted from the light emitting elements ED may be directly applied to the first electrode RME1 and the second electrode RME2, and the electrical signals may be transmitted to the other electrodes through the contact electrodes CNE and light emitting elements ED, which will be described later.

Each of the plurality of electrodes RME may include a conductive material having high reflectivity. For example, the electrode RME may include a metal such as silver (Ag), copper (Cu), or aluminum (Al) as a material having high reflectivity, or may be an alloy including aluminum (Al), nickel (Ni), lanthanum (La), and the like. The electrode RME may reflect, in the upward direction of each sub-pixel PXn, light emitted from the light emitting element ED and traveling to the side surface of the first bank BNL1 or the second bank BNL2.

However, the present disclosure is not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked, or may be formed as one layer including them. For example, each electrode RME may have a stacked structure of ITO/Ag/ITO, ITO/Ag/IZO, ITO/Ag/ITZO/IZO, or the like.

On the other hand, at least a part of the plurality of electrodes RME may include a portion partially having different widths. In accordance with one embodiment, the plurality of electrodes RME may include a first type electrode RME #1 including a portion whose width measured in the second direction DR2 varies depending on positions. Further, the plurality of electrodes RME may further include second type electrodes RME #2 facing the first type electrode RME #1 while being spaced from the first type electrode RME #1 and having a constant width measured in the second direction DR2 along the extension direction. The first type electrode RME #1 and the second type electrode RME #2 may face each other while being spaced from each other in the second direction DR2, and may have an asymmetric structure.

For example, the first type electrode RME #1 may include the first electrode RME1 and the fourth electrode RME4 arranged on the first bank BNL1, and the first electrode RME1 and the fourth electrodes RME4 may include a first portion RP1 and a second portion RP2 having a width that is smaller than a width of the first portion RP1.

The second type electrode RME #2 may include the second electrode RME2 and the third electrode RME3 arranged on the second bank BNL2, and the second electrode RME2 and the third electrode RME3 may have the same width as that of the second portion RP2 of the first type electrode RME #1. The first electrode RME1 and the fourth electrode RME4 may have a symmetrical structure. The first portions RP1 of the first electrode RME1 and the fourth electrode RME4 may be arranged side by side in the second direction DR2, and the second portions RP2 of the first electrode RME1 and the fourth electrode RME4 may be arranged side by side in the second direction DR2. In the first electrode RME1 and the fourth electrode RME4, the plurality of first portions RP1 and the plurality of second portions RP2 may be alternately repeated along the first direction DR1 and the widths thereof may vary along the first direction DR1. In other words, the second type electrode RME #2 has a uniform width, whereas the first type electrode RME #1 facing the second type electrode RME #2 has a structure in which the width varies. Therefore, they may have an asymmetric structure.

The first electrode RME1 will be used as an example to describe the shape of the first type electrode RME #1. The first electrode RME1 may include at least one first portion RP1 arranged in the emission area EMA. The plurality of first portions RP1 may be spaced from each other in the first direction DR1, and the second portion RP2 may be disposed therebetween. It is illustrated in FIG. 3 that two first portions RP1 are arranged in the emission area EMA and the second portion RP2 is disposed therebetween. The second portion RP2 may be located at the center (or the central region) of the emission area EMA, and the first portions RP1 may be located above and below the center of the emission area EMA. However, the disclosure is not limited thereto.

In one embodiment, the distance between the first portion RP1 of the first electrode RME1 and the third electrode RME3 may be equal to the distance between the second portion RP2 of the first electrode RME1 and the third electrode RME3. The first type electrode RME #1 may include the first portion RP1 and the second portion RP2 having different widths, and the inner side facing the second type electrode RME #2 may extend in parallel with one side of the second type electrode RME #2. For example, the inner side of the first electrode RME1 facing the third electrode RME3, which is one side of the first electrode RME1, may extend without being depressed or protruded in a specific direction (e.g., in the second direction DR2). In other words, one sides of the first portion RP1 and the second portion RP2 of the first electrode RME1 facing the third electrode RME3 may be aligned with each other along the first direction DR1. Similarly, the inner sides of the first portion RP1 and the second portion RP2 of the fourth electrode RME4 facing the second electrode RME2 may be aligned with each other along the first direction DR1. Further, the distance between the first electrode RME1 and the third electrode RME3 may be equal to the distance between the second electrode RME2 and the fourth electrode RME4 in the second direction DR2.

On the other hand, the outer side of the first type electrode RME #1 that does not face the second type electrode RME #2, between both sides of the first type electrode RME #1, has a shape that is bent or protrudes in a specific direction (e.g., in the second direction DR2), so that the width of the first type electrode RME #1 may vary. In other words, the distance between the plurality of electrodes RME spaced from each other in the second direction DR2 may be constant, and the width of the first type electrode RME #1 may vary depending on positions.

The width of the first portion RP1 may be the maximum width of the first type electrode RME #1. The width of the second portion RP2 may be the minimum width of the first type electrode RME #1 and may be equal to the width of the second type electrode RME #2. The first electrode RME1 and the fourth electrode RME4 may be formed with the same width as those of the second electrode RME2 and the third electrode RME3 except the first portion RP1, but may have a larger width at the first portion RP1. In one example, the maximum width of the first portion RP1 of the first type electrode RME #1 may be greater than the width of the first bank BNL1 measured in the second direction DR2, and the first type electrode RME #1 may be disposed to cover both sides of the first bank BNL1 at the first portion RP1.

In one embodiment, the outer side of the first portion RP1 of the first type electrode RME #1 that does not face the second type electrode RME #2 may have an inclined shape, and may have a triangular protruding shape in a plan view. The first portions RP1 of the first electrode RME1 and the fourth electrode RME4 that are the first type electrodes RME #1 may have the maximum width at the position where the inclined outer sides meet. The first electrode RME1 and the fourth electrode RME4 that are the first type electrodes RME #1 may have a shape in which the width of the first portion RP1 is gradually increased and then decreased from the position where the inclined outer sides meet. However, the present disclosure is not limited thereto.

The light emitting elements ED are arranged on the plurality of electrodes RME. The positions and the orientations of the light emitting elements ED may be changed by an electric field E (see FIG. 11) generated between the adjacent electrodes RME in a state where the light emitting elements ED are dispersed in ink. The electrical signal applied to the electrode RME to generate the electric field E may generate induced charge on ink molecules located on the electrodes RME. The ink molecules with the induced charge may be moved by the force of the electric field E, so that flow of droplets may occur inside the ink. Such flow may affect the positions and the orientations of the light emitting elements ED, and may be guided in a specific direction depending on the area or the width of the electrode RME. In the display device 10 according to one embodiment, any one electrode (e.g., the first type electrode RME #1) may partially have different widths compared to an electrode facing thereto (e.g., the second type electrode RME #2), and the alignment of the light emitting element ED in the specific location may be guided by controlling the ink flow to be directed in a specific direction in the process of arranging the light emitting elements ED between two adjacent electrodes RME.

Accordingly, most of the light emitting elements ED may be densely arranged on the first portion RP1 of the first type electrode RME #1. Among the light emitting elements ED, the number and the density or the denseness of the light emitting elements ED arranged on the first portion RP1 of the first type electrode RME #1 may be different from those of the light emitting elements ED arranged on the second portion RP2. A more detailed description will be given later.

The first insulating layer PAS1 is disposed on the plurality of electrodes RME, the first bank BNL1, and the second bank BNL2. The first insulating layer PAS1 is disposed to completely cover the plurality of electrodes RME, the first bank BNL1, and the second bank BNL2, so that the plurality of electrodes RME may be protected and insulated from each other. In addition, the first insulating layer PAS1 may prevent the light emitting element ED disposed thereon from being damaged by direct contact with other members.

In an embodiment, the first insulating layer PAS1 may have stepped portions such that the top surface thereof is partially depressed between the adjacent electrodes RME that are spaced from each other in the second direction DR2. The light emitting element ED may be disposed on the top surface of the first insulating layer PAS1, where the stepped portions are formed, and thus a space may remain between the light emitting element ED and the first insulating layer PAS1. However, the present disclosure is not limited thereto.

The first insulating layer PAS1 may include a plurality of contact portions CT1 and CT2 that expose a part of the top surface of each electrode RME. The contact portions CT1 and CT2 may penetrate the first insulating layer PAS1, and the contact electrodes CNE, which will be described later, may be in contact with the exposed electrodes RME through the contact portions CT1 and CT2.

In accordance with one embodiment, the plurality of contact portions CT1 and CT2 penetrating the first insulating layer PAS1 may be formed in the sub-area SA of each sub-pixel PXn. The plurality of contact portions CT1 and CT2 may penetrate the first insulating layer PAS1 to expose a part of the top surfaces of the electrodes RME. As described above, in the fabricating process of the display device 10, the light emitting elements ED may be sprayed onto the electrodes RME while being dispersed in the ink, and may be aligned by the electric field E applied between the adjacent electrodes RME. The first insulating layer PAS1 includes the plurality of contact portions CT1 and CT2 and is disposed to cover the electrodes RME. When the top surfaces of the electrodes RME are exposed by the contact portions CT1 and CT2, the electric field E generated at the contact portions CT1 and CT2 may be stronger than that generated at the other portions. In the display device 10 according to one embodiment, the contact portions CT1 and CT2 are formed not in the emission area EMA but in the sub-area SA, so that the area where the electric field E is strong due to the contact portions CT1 and CT2 may not be formed in the emission area EMA. Accordingly, it is possible to prevent the light emitting elements ED from being concentrated in an undesired area in the emission area EMA.

The third bank BNL3 may be disposed on the first insulating layer PAS1. The third bank BNL3 may include portions extending in the first direction DR1 and the second direction DR2 in a plan view, and thus may be arranged in a grid pattern. The first bank BNL1 may be disposed along the boundaries between the sub-pixels PXn to delimit the neighboring sub-pixels PXn. Further, the third bank BNL3 may be disposed to surround the emission area EMA and the sub-area SA disposed for each sub-pixel PXn to delimit them from each other. In the portion of the third bank BNL3 extending in the second direction DR2, the part disposed between the emission areas EMA may have a greater width than the part disposed between the sub-areas SA, and the distance between the sub-areas SA may be smaller than the distance between the emission areas EMA. However, the present disclosure is not limited thereto, and vice versa. That is, the width of the third bank BNL3 may be varied so that the distance between the sub-areas SA may be greater than the distance between the emission areas EMA.

The third bank BNL3 may be formed with a height greater than those of the first bank BNL1 and the second bank BNL2. The third bank BNL3 may prevent ink from overflowing to the adjacent sub-pixels PXn during the inkjet printing process of the fabricating process of the display device 10, thereby separating inks in which different light emitting elements ED are dispersed for the corresponding sub-pixels PXn such that the inks are not mixed. Similarly to the first bank BNL1, the third bank BNL3 may include polyimide (P1), but is not limited thereto.

Further, the portion of the third bank BNL3 extending in the second direction DR2 may partially overlap the first bank BNL1 and the second bank BNL2. The portion of the third bank BNL3 overlapping the first bank BNL1 and the second bank BNL2 may be higher than the other portions. As will be described later, the contact electrodes CNE may be arranged on the portion of the third bank BNL3 overlapping the first bank BNL1 and the second bank BNL2, and the stepped portion of the third bank BNL3 may prevent adjacent contact electrodes CNE from being short-circuited.

The light emitting element ED may be disposed on the first insulating layer PAS1. The plurality of light emitting elements ED may be disposed to be spaced from each other along the first direction DR1 in which the electrodes RME extend, and may be aligned substantially parallel to each other. The light emitting element ED may have a shape extending in one direction(e.g., the second direction DR2), and the extension direction of the light emitting element ED may be substantially perpendicular to the extension direction of the electrodes RME. However, the present disclosure is not limited thereto, and the light emitting elements ED may each be arranged to extend in a direction oblique to the extension direction of the electrodes RME.

The light emitting element ED may include semiconductor layers doped with different conductivity type dopants. The light emitting element ED may include a plurality of semiconductor layers and may be oriented such that one end thereof faces a certain direction according to the direction of the electric field generated on the electrode RME. Further, the light emitting element ED may include a light emitting layer 36 (see FIG. 8) to emit light of a desired wavelength band (e.g., a predetermined wavelength band). The light emitting element ED aligned in each sub-pixel PXn may emit light of a different wavelength band according to the material constituting the light emitting layer 36. However, the present disclosure is not limited thereto, and the light emitting element ED aligned in each sub-pixel PXn may emit the same color light.

The light emitting element ED may include a plurality of layers arranged in a direction parallel to the top surface of the first substrate SUB. The light emitting element ED of the display device 10 may be disposed such that one extension direction thereof is parallel to the first substrate SUB, and the plurality of semiconductor layers included in the light emitting element ED may be sequentially arranged in a direction parallel to the top surface of the first substrate SUB. However, the present disclosure is not limited thereto. In some cases, when the light emitting element ED has a different structure, the plurality of layers may be arranged in a direction perpendicular to the first substrate SUB.

The light emitting element ED may be disposed above the electrodes RME that are spaced from each other in the second direction DR2 between the first bank BNL1 and the second bank BNL2. The extension length of the light emitting element ED may be greater than the distance between the electrodes RME that are spaced from each other in the second direction DR2, and the both ends of the light emitting element ED may be disposed on different electrodes. One end of the light emitting element ED may be disposed on the first type electrode RME #1, and the other end of the light emitting element ED may be disposed on the second type electrode RME #2. Further, the plurality of light emitting elements ED may include a plurality of light emitting element groups ED #1 and ED #2 arranged adjacent to each other depending on the position of the first portion RP1 of the first type electrode RME #1.

The plurality of light emitting element groups ED #1 and ED #2 may be spaced from each other in the first direction DR1 depending on the position of the first portion RP1 of the first type electrode RME #1. For example, the light emitting element ED may include, as the first light emitting element group ED #1, a first light emitting element ED1 having both ends arranged on the first electrode RME1 and the third electrode RME3, and a second light emitting element ED2 having both ends arranged on the second electrode RME2 and the fourth electrode RME4. Further, the light emitting element ED may include, as the second light emitting element group ED #2 spaced from the first light emitting element group ED #1 in the first direction DR1, a third light emitting element ED3 having both ends arranged on the first electrode RME1 and the third electrode RME3, and a fourth light emitting element ED4 having both ends arranged on the second electrode RME2 and the fourth electrode RME4.

In this specification, "density of light emitting elements," "denseness of light emitting elements," "density of light emitting element groups," "denseness of light emitting element groups" and the like are related to the number of the light emitting elements ED arranged on the electrodes RME, and may relatively define the number or the distribution of the light emitting elements ED arranged in any area defined on the electrodes RME. For example, the denseness of the first light emitting element group ED #1, which is the number of the light emitting elements having one ends arranged on any one of the first portion RP1 of the first electrode RME1 or the first portion RP1 of the fourth electrode RME4, may be defined as the number of the light emitting elements ED arranged in a unit area that is the area occupied by the first portions RP1 of the first electrode RME1 and the fourth electrode RME4 and the portions of the second electrode RME2 and the third electrode RME3 corresponding thereto. "Denseness" may not mean an absolute value and may be defined to roughly compare the number of light emitting elements ED between certain areas.

As described above, the first electrode RME1 and the fourth electrode RME4 that are the first type electrodes RME #1 may include the first portion RP1 and the second portion RP2 having different widths, and the change in the width of the first type electrode RME #1 may cause the light emitting elements ED to be concentrated in a specific location. When the second type electrode RME #2 has a uniform width, the light emitting elements ED may be guided to move toward the first portion RP1 of the first type electrode RME #1 having a large width. Although the strength of the electric field E generated on the electrodes RME may vary depending on the width of the first type electrode RME #1, the ink flow is caused by the width of the first type electrode RME #1 and the light emitting elements ED may be moved in a specific direction.

The light emitting elements ED arranged in each sub-pixel PXn are not uniformly arranged on the electrode RME, and are non-uniformly arranged depending on the position of the first portion RP1. The denseness of the light emitting elements ED of the first light emitting element group ED #1 and the second light emitting element group ED #2 may be higher on the electrode RME than on the other parts. The light emitting elements ED may be guided to be arranged on the first portion RP1 of the first type electrode RME #1, and the arrangement of the light emitting element groups ED #1 and ED #2 may vary depending on the position of the first portion RP1. For example, as in the embodiment of FIG. 3, when the second portion RP2 of the first type electrode RME #1 is located at the center of the emission area EMA, and the first portion RP1 is located on both sides in the first direction DR1 with respect to the second portion RP2, the first light emitting element group ED #1 and the second light emitting element group ED #2 may be arranged above and below the center (e.g., the central region) of the emission area EMA. Although some of the light emitting elements ED may be arranged at the center (e.g., the central region) of the emission area EMA, the number thereof may be smaller than that of the first light emitting element group ED #1 or the second light emitting element group ED #2. The first light emitting element group ED #1 and the second light emitting element group ED #2 may be classified based on the denseness difference between them and other adjacent light emitting elements ED regardless of the arrangement positions thereof.

In the display device 10, the position of the first portion RP1 of the first type electrode RME #1 may be adjusted to concentrate the light emitting elements ED in a specific location. Accordingly, the display device 10 may reduce the number of light emitting elements ED that are lost without being arranged on the electrodes RME in the emission area EMA.

In some embodiments, the light emitting element ED may include a plurality of semiconductor layers, and a first end and a second end opposite thereto may be defined with respect to any one semiconductor layer. The light emitting element ED may be disposed such that the first end and the second end are respectively placed on specific electrodes RME. For example, the first light emitting element ED1 may be disposed such that the first end is disposed on the first electrode RME1 and the second end is disposed on the third electrode RME3. The second light emitting element ED2 may be disposed such that the first end is disposed on the fourth electrode RME4 and the second end is disposed on the second electrode RME2. The first ends and the second ends of the light emitting elements ED may be electrically connected to different electrodes RME. However, the present disclosure is not limited thereto, and at least some of the light emitting elements ED may be arranged such that only one ends are disposed on the electrode RME depending on the orientation between the electrodes RME, or the first ends and the second ends may face different directions.

The both ends of the light emitting element ED may contact the respective contact electrodes CNE. In the light emitting element ED, because an insulating layer 38 (see FIG. 8) is not formed on the end surfaces (e.g., the first end and the second end of the light emitting element ED) in the extension direction, and thus the semiconductor layer is partially exposed, the exposed semiconductor layer may be in contact with the contact electrode CNE. However, the present disclosure is not limited thereto. In some cases, in the light emitting element ED, at least a part of the insulating layer 38 is removed, so that the side surfaces at both ends of the semiconductor layers may be partially exposed. The side surfaces of the exposed semiconductor layer may be in direct contact with the contact electrodes CNE. Both ends of the light emitting element ED may be electrically connected to the electrode RME through different contact electrodes CNE. The display device 10 may include the first type electrode RME #1 and the second type electrode RME #2 so that the light emitting elements ED may be concentrated in a specific location, and the plurality of light emitting element groups ED #1 and ED #2 may be connected in series through different contact electrodes CNEs in the emission area EMA. The display device 10 may secure a space for connecting the light emitting element groups ED #1 and ED #2 in series by guiding the arrangement of the light emitting elements ED without separating the electrodes RME. The display device 10 may further improve brightness of each sub-pixel PXn by connecting the light emitting element groups ED #1 and ED #2 in series.

The second insulating layer PAS2 may be partially disposed on the first insulating layer PAS1 and the light emitting element ED. For example, the second insulating layer PAS2 is disposed to partially cover the outer surface of the light emitting element ED so as not to cover the first and second ends of the light emitting element ED. The portion of the second insulating layer PAS2 disposed on the light emitting element ED may extend in the second direction DR2 on the first insulating layer PAS1 in a plan view, so that it may form a linear or island-like pattern in each sub-pixel PXn. The second insulating layer PAS2 may protect the light emitting element ED while fixing the light emitting element ED during the fabrication process of the display device 10. Further, the second insulating layer PAS2 may be disposed to fill the space between the light emitting element ED and the first insulating layer PAS1 thereunder.

Further, the second insulating layer PAS2 may also be disposed on the first bank BNL1, the second bank BNL2, and the third bank BNL3. The second insulating layer PAS2 may be disposed on the first insulating layer PAS1 and the third bank BNL3 while exposing the both ends of the light emitting element ED and partially exposing the portions where the electrodes RME are disposed. The shape of the second insulating layer PAS2 may be formed through steps of entirely disposing it on the first insulating layer PAS1 and partially removing it to expose the both ends of the light emitting element ED, during the fabrication process of the display device 10.

The second insulating layer PAS2 may be disposed to expose both ends of the concentratedly arranged light emitting elements ED of the first light emitting element group ED #1 and the second light emitting element group ED #2. The emission area EMA may include the area where the second portion RP2 of the first type electrode RME #1 is disposed, as the area other than the area where the first light emitting element group ED #1 and the second light emitting element group ED #2 are arranged. The denseness of the light emitting element ED may be lower in the area where the second portion RP2 of the first type electrode RME #1 is disposed than in the first portion RP1, and the second insulating layer PAS2 may be disposed on the second portion RP2 of the first type electrode RME #1 to cover the first insulating layer PAS1. As shown in FIG. 6, the light emitting elements ED are not arranged in the area across the second portion RP2 of the first type electrode RME #1, or the number of the light emitting elements ED arranged in the corresponding area may be smaller than that in the first portion RP1. The second insulating layer PAS2 may be arranged in the corresponding area to cover the entire first insulating layer PAS1. Even if the light emitting elements ED are arranged, they may not be connected to the contact electrode CNE. Although it is illustrated in FIG. 3 that no light emitting element ED is disposed on the second portion RP2 of the first type electrode RME #1, the present disclosure is not limited thereto. The light emitting elements ED may be arranged less densely on the second portion RP2 of the first type electrode RME #1 than on the first portion RP1. However, the light emitting elements ED arranged on the second portion RP2 may not be connected to the contact electrode CNE in a state where both ends thereof are covered by the second insulating layer PAS2.

On the other hand, in some embodiments, the second insulating layer PAS2 may be partially disposed in the sub-area SA. The electrodes RME arranged in the plurality of sub-pixels PXn may be connected to each other while extending in the second direction DR2, and may be separated from the sub-area SA after the light emitting elements ED are aligned and the second insulating layer PAS2 is formed. In the process of separating the electrode RME, the first insulating layer PAS1 and the second insulating layer PAS2 as well as the electrodes RME may be partially removed.

The plurality of contact electrodes CNE and a third insulating layer PAS3 may be arranged on the second insulating layer PAS2. The contact electrode CNE may be in contact with any one end of the light emitting element ED and at least one electrode RME. For example, the contact electrode CNE may be in contact with one end of the light emitting element ED exposed without the second insulating layer PAS2 disposed thereon, and at least one of the electrodes RME through the contact portions CT1 and CT2 formed in the first insulating layer PAS1 to partially expose the electrodes RME.

In accordance with one embodiment, the contact electrodes CNE of the display device 10 may be classified into a first type contact electrode disposed only on the electrodes RME directly connected to the fourth conductive layer, and a second type contact electrode also disposed on the electrodes RME that are not directly connected to the fourth conductive layer. The first type contact electrode may connect some of the light emitting elements ED to the electrodes RME, and the second type contact electrode may connect substantially different light emitting elements ED.

For example, the contact electrode CNE may include a first contact electrode CNE1 and a second contact electrode CNE2 as first type contact electrodes disposed on the first electrode RME1 or the second electrode RME2. The first contact electrode CNE1 and the second contact electrode CNE2 may be disposed on a part of the first electrode RME1 and the second electrode RME2, respectively. The first contact electrode CNE1 and the second contact electrode CNE2 each have a shape extending in the first direction DR1, and may form linear patterns in each sub-pixel PXn. Each of the first contact electrode CNE1 and the second contact electrode CNE2 may be partially disposed in the sub-area SA over the third bank BNL3. The first contact electrode CNE1 may be in contact with the first electrode RME1 through the first contact portion CT1 that exposes the top surface of the first electrode RME1 in the sub-area SA, and the second contact electrode CNE2 may be in contact with the second electrode RME2 through the first contact portion CT1 that exposes the top surface of the second electrode RME2.

Further, the first contact electrode CNE1 may be in contact with the first end of the first light emitting element ED1 and the second contact electrode CNE2 may be in contact with the second end of the second light emitting element ED2. Each of the first contact electrode CNE1 and the second contact electrode CNE2 as the first type contact electrode may transmit an electrical signal applied to the first type electrode (e.g., RME1 and RME2) to one end of the light emitting element ED. The electrical signals may be directly applied to the first end of the first light emitting element ED1 and the second end of the second light emitting element ED2, and transmitted to other contact electrodes CNE and other light emitting elements ED through the second end of the first light emitting element ED1 and the first end of the second light emitting element ED2.

The contact electrode CNE that is the second type contact electrode disposed along different electrodes RME may include a third contact electrode CNE3, a fourth contact electrode CNE4, and a fifth contact electrode CNE5.

The third contact electrode CNE3 may be disposed above the first electrode RME1 and the third electrode RME3. The third contact electrode CNE3 may include a first extension portion CN_E1 and a second extension portion CN_E2 extending in the first direction DR1, and a first connection portion CN_B1 connecting the first extension portion CN_E1 to the second extension portion CN_E2 in the emission area EMA. The third contact electrode CNE3 may extend substantially in the first direction DR1 and may be bent to be disposed on the third electrode RME3 and the first electrode RME1. The first extension portion CN_E1 may be disposed on the third electrode RME3 to be in contact with the second end of the first light emitting element ED1. The second extension portion CN_E2 may be disposed on the first electrode RME1 while being spaced from the first contact electrode CNE1 in the first direction DR1, and may be in contact with the first end of the third light emitting element ED3. The first connection portion CN_B1 may be disposed along the first electrode RME1 and the third electrode RME3. The first extension portion CN_E1 of the third contact electrode CNE3 may also be disposed in the sub-area SA over the third bank BNL3. The third contact electrode CNE3 may be in contact with the third electrode RME3 through the second contact portion CT2 that exposes the top surface of the third electrode RME3 in the sub-area SA.

The fourth contact electrode CNE4 may be disposed on the third electrode RME3 and the fourth electrode RME4. The fourth contact electrode CNE4 may include a third extension portion CN_E3 and a fourth extension portion CN_E4 extending in the first direction DR1, and a second connection portion CN_B2 connecting the third extension portion CN_E3 and the fourth extension portion CN_E4 in the emission area EMA. The third extension portion CN_E3 may be disposed on the third electrode RME3 and may be in contact with the second end of the third light emitting element ED3. The fourth extension portion CN_E4 may be in contact with the first end of the fourth light emitting element ED4 on the fourth electrode RME4. The second connection portion CN_B2 is disposed along the third electrode RME3, the second electrode RME2, and the fourth electrode RME4. The second connection portion CN_B2 may be disposed at one side of the emission area EMA adjacent to another sub-pixel PXn and connect the third extension portion CN_E3 and the fourth extension portion CN_E4. The fourth contact electrode CNE4 may have a shape to be around (e.g., surrounding) the fifth extension portion CN_E5 of the fifth contact electrode CNE5. Unlike other contact electrodes, the fourth contact electrode CNE4 is disposed only in the emission area EMA and may not be directly connected to the plurality of electrodes RME.

The fifth contact electrode CNE5 may have a shape similar to that of the third contact electrode CNE3 and may be disposed on the second electrode RME2 and the fourth electrode RME4. The fifth contact electrode CNE5 may include a fifth extension portion CN_E5 and a sixth extension portion CN_E6 extending in the first direction DR1, and a third connection portion CN_B3 connecting the fifth extension portion CN_E5 and the sixth extension portion CN_E6 in the emission area EMA. The fifth extension portion CN_E5 may be disposed on the second electrode RME2 while being spaced from the second contact electrode CNE2 in the first direction DR1, and may be in contact with the second end of the fourth light emitting element ED4. The sixth extension portion CN_E6 is disposed on the fourth electrode RME4 while being spaced from the fourth extension portion CN_E4 in the first direction DR1, and may be in contact with the first end of the second light emitting element ED2. The third connection portion CN_B3 may be disposed along the second electrode RME2 and the fourth electrode RME4. The sixth extension portion CN_E6 of the fifth contact electrode CNE5 may also be disposed in the sub-area SA over the third bank BNL3. The fifth contact electrode CNE5 may be in contact with the fourth electrode RME4 through the second contact portion CT2 exposing the top surface of the fourth electrode RME4 in the sub-area SA.

The first light emitting element ED1 may be electrically connected to the third light emitting element ED3 through the third contact electrode CNE3. The electrical signal applied to the first contact electrode CNE1 may be transmitted to the third light emitting element ED3 through the first light emitting element ED1 and the third contact electrode CNE3. The first light emitting element ED1 and the third light emitting element ED3 may be arranged on the first electrode RME1 and the third electrode RME3. However, they may be in contact with different contact electrodes CNE, and may be connected in series through the third contact electrode CNE3 that is the second type contact electrode. Similarly, the third light emitting element ED3 and the fourth light emitting element ED4 may be connected in series through the fourth contact electrode CNE4, and the fourth light emitting element ED4 and the second light emitting element ED2 may be connected in series through the fifth contact electrode CNE5.

The second type contact electrodes may be arranged along one or more electrodes RME. Some of the connection portions of the second type contact electrodes may be arranged in the region between the first light emitting element group ED #1 and the second light emitting element group ED #2. The first connection portion CN_B1 of the third contact electrode CNE3 and the third connection portion CN_B3 of the fifth contact electrode CNE5 may be arranged along the second portion RP2 of the first type electrode RME #1. However, the light emitting elements ED may be less densely arranged on the second portion RP2 of the first type electrode RME #1, and the second insulating layer PAS2 may also be disposed to cover the first insulating layer PAS1 on the second portion RP2. Even if the first connection portion CN_B1 and the third connection portion CN_B3 are arranged on the second portion RP2 of the first type electrode RME #1, they may not be in contact with the light emitting element ED covered by the second insulating layer PAS2. The display device 10 may secure the space where the connection portions of the contact electrodes CNE are arranged by forming the area where the light emitting elements ED are less densely arranged in the area between the electrodes RME in the emission area EMA, and the plurality of light emitting elements ED may be connected in series in the sub-pixel PXn. Further, the second insulating layer PAS2 is disposed to cover the first insulating layer PAS1 in the area where the light emitting elements ED are less densely arranged, so that it is possible to prevent a short circuit from occurring in the corresponding area by the contact electrode CNE and the light emitting element ED.

On the other hand, the contact portions CT1 and CT2 formed at the portion where the contact electrodes CNE and the electrode RME are in contact with each other are arranged without overlapping the light emitting elements ED in the second direction DR2. Each of the contact portions CT1 and CT2 is disposed in the sub-area SA while being spaced in the first direction DR1 from the area where the plurality of light emitting elements ED are arranged. Lights are emitted from the both ends of the light emitting element ED, and the contact portions CT1 and CT2 may be positioned out of the traveling paths of the lights. However, the present disclosure is not limited thereto, and the positions of the contact portions CT1 and CT2 may vary depending on the structure of the electrode RME and the positions of the light emitting elements ED.

The contact electrode CNE may include a conductive material. For example, the contact electrode CNE may include ITO, IZO, ITZO, aluminum (Al), or the like. As an example, the contact electrodes CNE may include a transparent conductive material, and light emitted from the light emitting element ED may pass through the contact electrodes CNE and proceed toward the electrodes RME. However, the present disclosure is not limited thereto.

The third insulating layer PAS3 is disposed on the third contact electrode CNE3 and the fifth contact electrode CNE5. Further, the third insulating layer PAS3 may also be disposed on the second insulation layer PAS2 except the area where the first contact electrode CNE1, the second contact electrode CNE2, and the fourth contact electrode CNE4 are arranged. The third insulating layer PAS3 may insulate the contact electrodes CNE arranged in different layers so that they are not directly connected to each other. However, in some embodiments, the third insulating layer PAS3 may be omitted, and the plurality of contact electrodes CNE may be arranged in substantially the same layer.

The display device 10 may include the third insulating layer PAS3. Some of the plurality of contact electrodes CNE may be arranged in the same layer, and some other contact electrodes CNE may be arranged in different layers. For example, the third contact electrode CNE3 and the fifth contact electrode CNE5 may be arranged on the second insulating layer PAS2, and the first contact electrode CNE1, the second contact electrode CNE2, and the fourth contact electrode CNE4 may be arranged on the third insulating layer PAS3. The third contact electrode CNE3 and the fifth contact electrode CNE5 may be arranged in the area where the second insulating layer PAS2 is patterned and exposed, and the first contact electrode CNE1, the second contact electrode CNE2, and the fourth contact electrode CNE4 may be arranged in the area where the second insulating layer PAS2 and the third insulating layer PAS3 are patterned and exposed. However, the first contact electrode CNE1, the second contact electrode CNE2, and the fourth contact electrode CNE4 may be directly arranged on the first insulating layer PAS1 in the area where the second insulating layer PAS2 and the third insulating layer PAS3 are not arranged and both ends of the light emitting element ED are exposed.

In some embodiments, an insulating layer that covers the plurality of contact electrodes CNE, the third insulating layer PAS3, and the third bank BNL3 may be further disposed. The insulating layer may be disposed all over the first substrate SUB to protect the members disposed on the first substrate SUB from the external environment.

Each of the first insulating layer PAS1, the second insulating layer PAS2 and the third insulating layer PAS3 described above may include an inorganic insulating material or an organic insulating material. However, the present disclosure is not limited thereto.

On the other hand, as described above, in the display device 10, the third insulating layer PAS3 may be omitted. Accordingly, the plurality of contact electrodes CNE may be arranged in substantially the same layer regardless of types.

Figure 7:
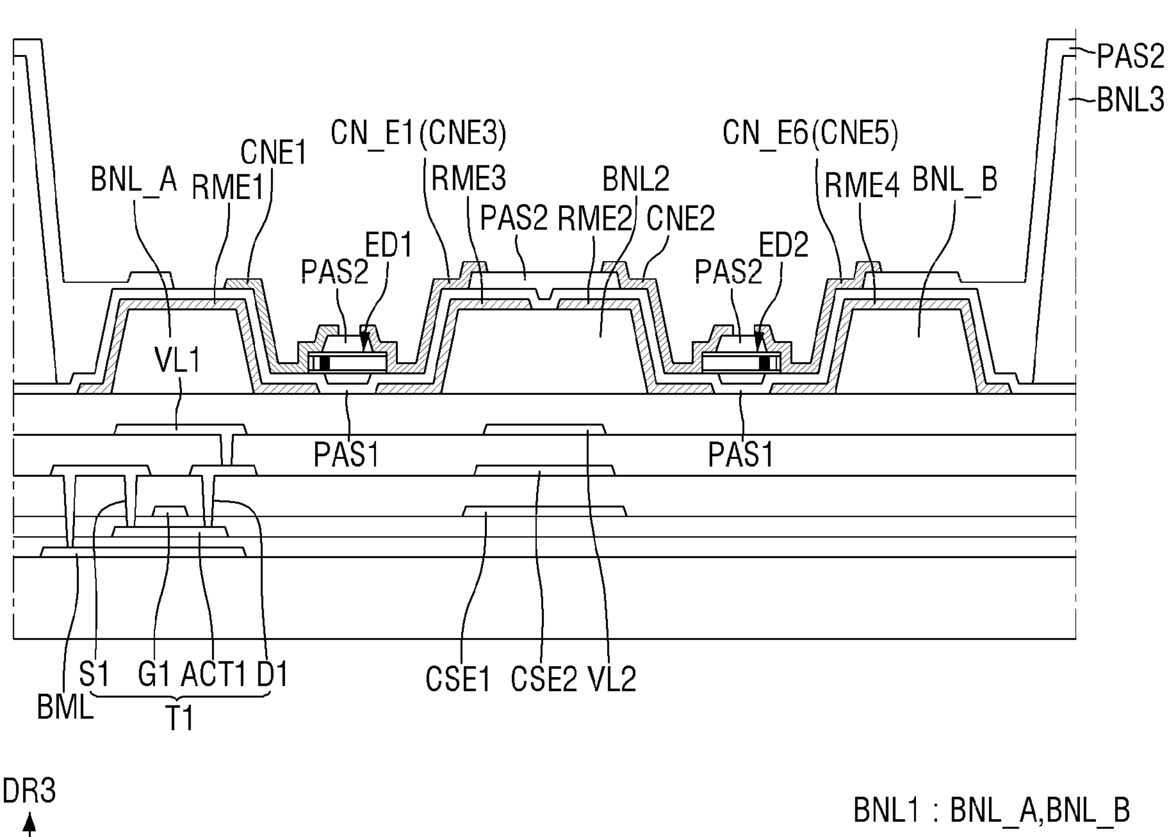
FIG. 7 is a cross-sectional view illustrating a portion of a display device according to another embodiment.

FIG. 7 is a cross-sectional view illustrating a portion of a display device according to an embodiment. FIG. 7 shows a cross section through both ends of the first light emitting element ED1 and the second light emitting element ED2 to correspond to area Q2-Q2' of FIG. 4.

Referring to FIG. 7, in the display device 10, the third insulating layer PAS3 may be omitted, and the first contact electrode CNE1, the second contact electrode CNE2, and the fourth contact electrode CNE4 (not shown in FIG. 7) arranged on the third insulating layer PAS3 may be directly arranged on the second insulating layer PAS2. The plurality of contact electrodes CNE may be formed by the same process to be spaced from each other without direct contact. For example, the contact electrodes CNE arranged on electrodes RME spaced from each other in the second direction DR2 may be spaced from each other on the second insulating layer PAS2 that covers the light emitting element ED. The second insulating layer PAS2 may be formed to cover the first insulating layer PAS1 and the light emitting element ED in the fabricating process and then expose both ends of the light emitting element ED. The display device 10 according to the described embodiment may reduce the fabricating process by omitting the third insulating layer PAS3 and forming the plurality of contact electrodes CNE at the same time. Because the cross section through both ends of the first light emitting element ED1 and the second light emitting element ED2 is illustrated in the drawing, the fourth contact electrode CNE4 is not shown. However, similar to the first contact electrode CNE1 and the second contact electrode CNE2, the fourth contact electrode CNE4 may be directly disposed on the second insulating layer PAS2 because the third insulating layer PAS3 is omitted.

Figure 8:
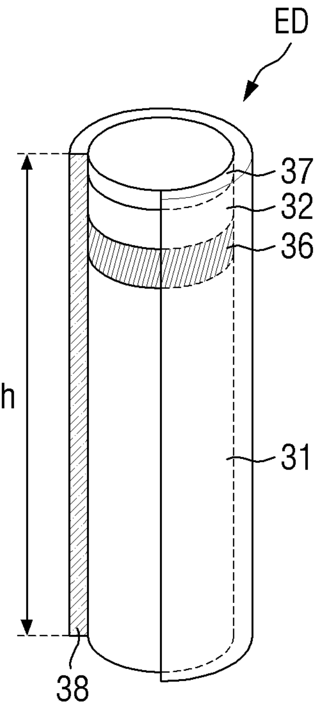
FIG. 8 is a schematic view of a light emitting element according to one embodiment.

FIG. 8 is a schematic view of a light emitting element according to one embodiment.

Referring to FIG. 8, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes that are opposite each other.

The light emitting element ED according to one embodiment may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) impurities. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating layer 38.

The first semiconductor layer 31 may be an n-type semiconductor. The first semiconductor layer 31 may include a semiconductor material having a chemical formula of AlxGayIn1-x-yN ($0 \le x \le 1$, $0 \le y \le 1$, $0 \le x+y \le 1$). For example, it may be any one or more of n-type doped AlGaInN, GaN, AIGaN, InGaN, AIN and InN. The n-type dopant doped into the first semiconductor layer 31 may be Si, Ge, Sn, or the like. However, the present disclosure is not limited thereto. The first end of the light emitting element ED may be a part in which the first semiconductor layer 31 is disposed in relation to the light emitting layer 36.

The second semiconductor layer 32 is disposed on the light emitting layer 36 to be described later. The second semiconductor layer 32 may be a p-type semiconductor, and the second semiconductor layer 32 may include a semiconductor material having a chemical formula of AlxGayln1-x-yN ($0 \le x \le 1$, $0 \le y \le 1$, $0 \le x+y \le 1$). For example, it may be any one or more of p-type doped AlGaInN, GaN, AIGaN, InGaN, AIN and InN. The p-type dopant doped into the second semiconductor layer 32 may be Mg, Zn, Ca, Se, Ba, or the like. However, the present disclosure is not limited thereto. The second end of the light emitting element ED may be a part in which the second semiconductor layer 32 is disposed in relation to the light emitting layer 36.

Although it is illustrated in FIG. 8 that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AIGaN or AlGaInN. For example, when the light emitting layer 36 has a structure in which quantum layers and well layers are alternately stacked in a multiple quantum well structure, the quantum layer may include a material such as AIGaN or AlGaInN, and the well layer may include a material such as GaN or AlInN.

However, the present disclosure is not limited thereto, and the light emitting layer 36 may have a structure in which semiconductor materials having large band gap energy and semiconductor materials having small band gap energy are alternately stacked, and may include other Group III to Group V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be an ohmic contact electrode. However, the present disclosure is not limited thereto, and it may be a Schottky contact electrode. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a contact electrode, the electrode layer 37 may reduce the resistance between the light emitting element ED and the electrode or contact electrode. The electrode layer 37 may include a conductive metal. For example, the electrode layer 370 may include at least one of aluminum (Al), titanium (Ti), indium (In), gold (Au), silver (Ag), ITO, IZO, or ITZO. However, the present disclosure is not limited thereto.

The insulating layer 38 is arranged to surround the outer surfaces (e.g., the outer peripheral or circumferential surfaces) of the plurality of semiconductor layers and electrode layers described above. For example, the insulating layer 38 may be disposed to surround at least the outer surface (e.g., the outer peripheral or circumferential surface) of the light emitting layer 36, and may be formed to expose both ends of the light emitting element ED in the longitudinal direction. Further, in cross-sectional view, the insulating layer 38 may have a top surface, which is rounded in a region adjacent to at least one end of the light emitting element ED.

The insulating layer 38 may include a material having insulating properties, such as silicon oxide ($SiO_x$), silicon nitride ($SiN_x$), silicon oxynitride ($SiO_xN_y$), aluminum nitride ($AlN_x$), and aluminum oxide $AlO_x$). Although it is shown in FIG. 8 that the insulating layer 38 is formed as a single layer, the present disclosure is not limited thereto. In some embodiments, the insulating layer 38 may be formed in a multilayer structure in which a plurality of layers are stacked.

The insulating layer 38 may function to protect the members. The insulating layer 38 may prevent an electrical short circuit that is likely to occur at the light emitting layer 36 when an electrode to which an electrical signal is transmitted is in direct contact with the light emitting element ED. In addition, the insulating layer 38 may prevent a decrease in light emission efficiency of the light emitting element ED.

Further, the insulating layer 38 may have an outer surface (e.g., an outer peripheral or circumferential surface) that is surface-treated. The light emitting elements ED may be aligned in such a way of spraying the ink in which the light emitting elements ED are dispersed on the electrodes. Here, the surface of the insulating layer 38 may be treated in a hydrophobic or hydrophilic manner in order to keep the light emitting elements ED in a dispersed state without aggregation with other light emitting elements ED adjacent in the ink.

The display device 10 according to one embodiment may include the electrodes RME having an asymmetrical structure so that the light emitting elements ED may be concentrated in a specific location. Such arrangement may be obtained by the ink flow due to the structure of the electrode RME after the ink containing the light emitting elements ED is sprayed onto the electrodes RME during the fabricating process of the display device 10.

FIGS. 9-12 are plan views showing parts of the fabrication process of a display device according to one embodiment.

Figure 9:
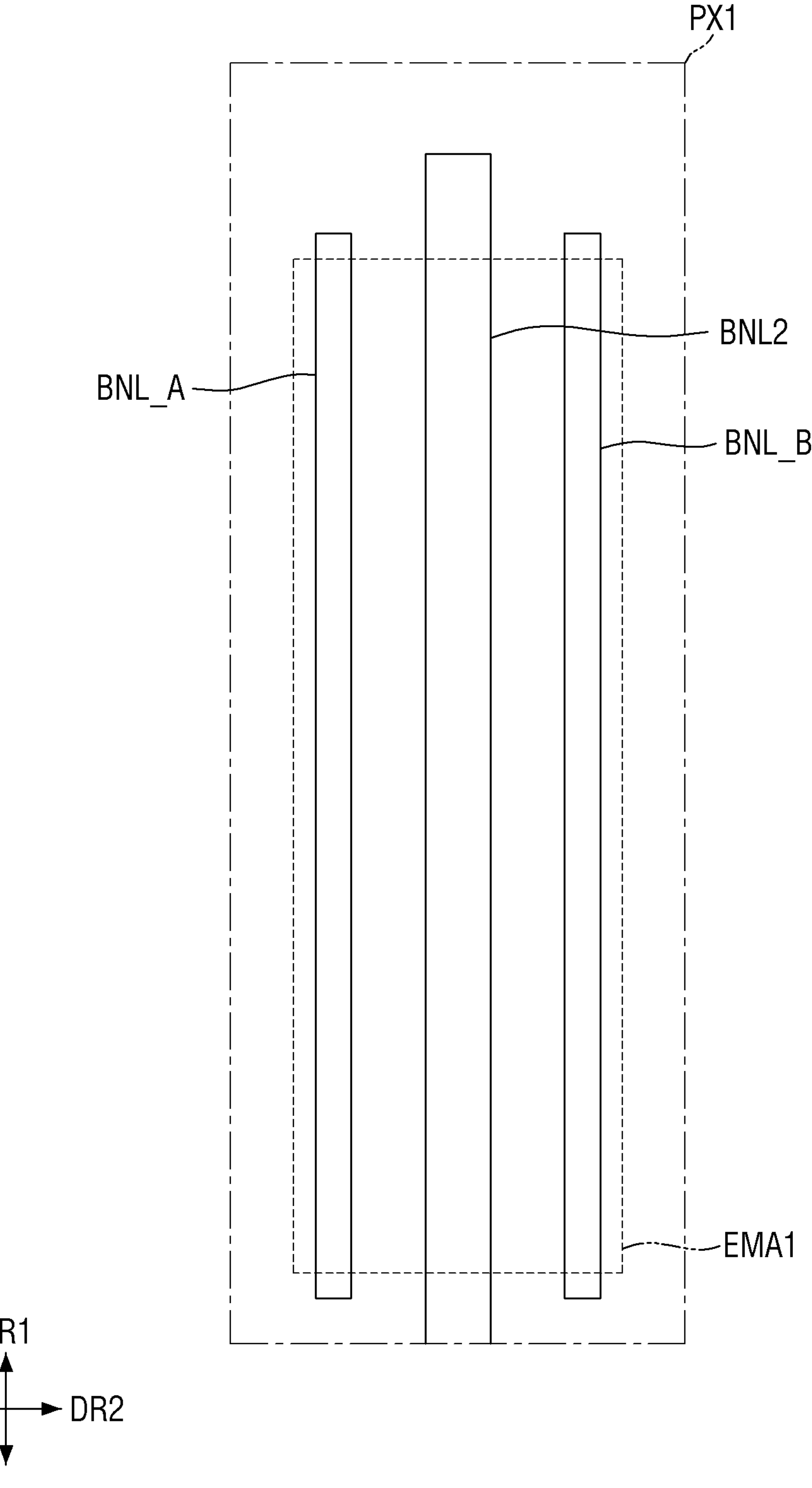
FIGS. 9-12 are plan views showing parts of the fabricating process of a display device according to one embodiment.

First, referring to FIG. 9, in the fabrication process of the display device 10, the first substrate SUB and the circuit layer CCL disposed on the first substrate SUB are formed, and the first bank BNL1 (BNL_A and BNL_B) and the second bank BNL2 arranged on the third interlayer insulating layer IL3 are formed. The structures of the first bank BNL1 and the second bank BNL2 are the same as those in the above description.

Figure 10:
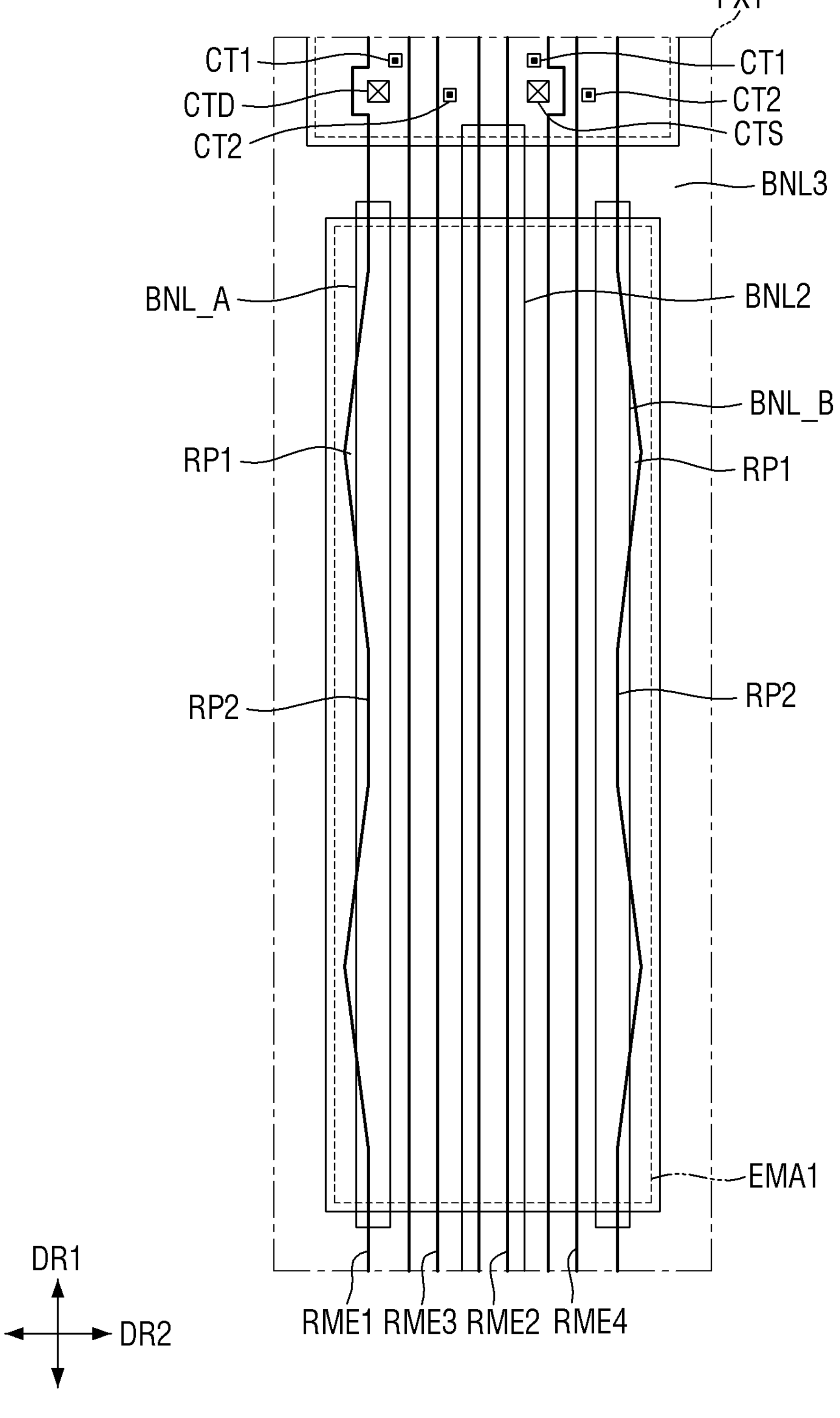

Next, referring to FIG. 10, the plurality of electrodes RME1, RME2, RME3, and RME4 arranged on the first bank BNL1 and the second bank BNL2, the first insulating layer PAS1, and the third bank BNL3 are formed.

The plurality of electrodes RME1, RME2, RME3, and RME4 may be arranged for each sub-pixel PXn while extending in the first direction DR1. The shapes of the electrodes RME1, RME2, RME3, and RME4 are the same as those in the above description. In other words, the first electrode RME1 and the fourth electrode RME4 may include the first portion RP1 and the second portion RP2 having different widths depending on positions.

The first insulating layer PAS1 including the plurality of contact portions CT1 and CT2 may be disposed on the electrodes RME1, RME2, RME3, and RME4, and the third bank BNL3 surrounding the emission area EMA and the sub-area SA may be disposed on the first insulating layer PAS1.

Figure 11:
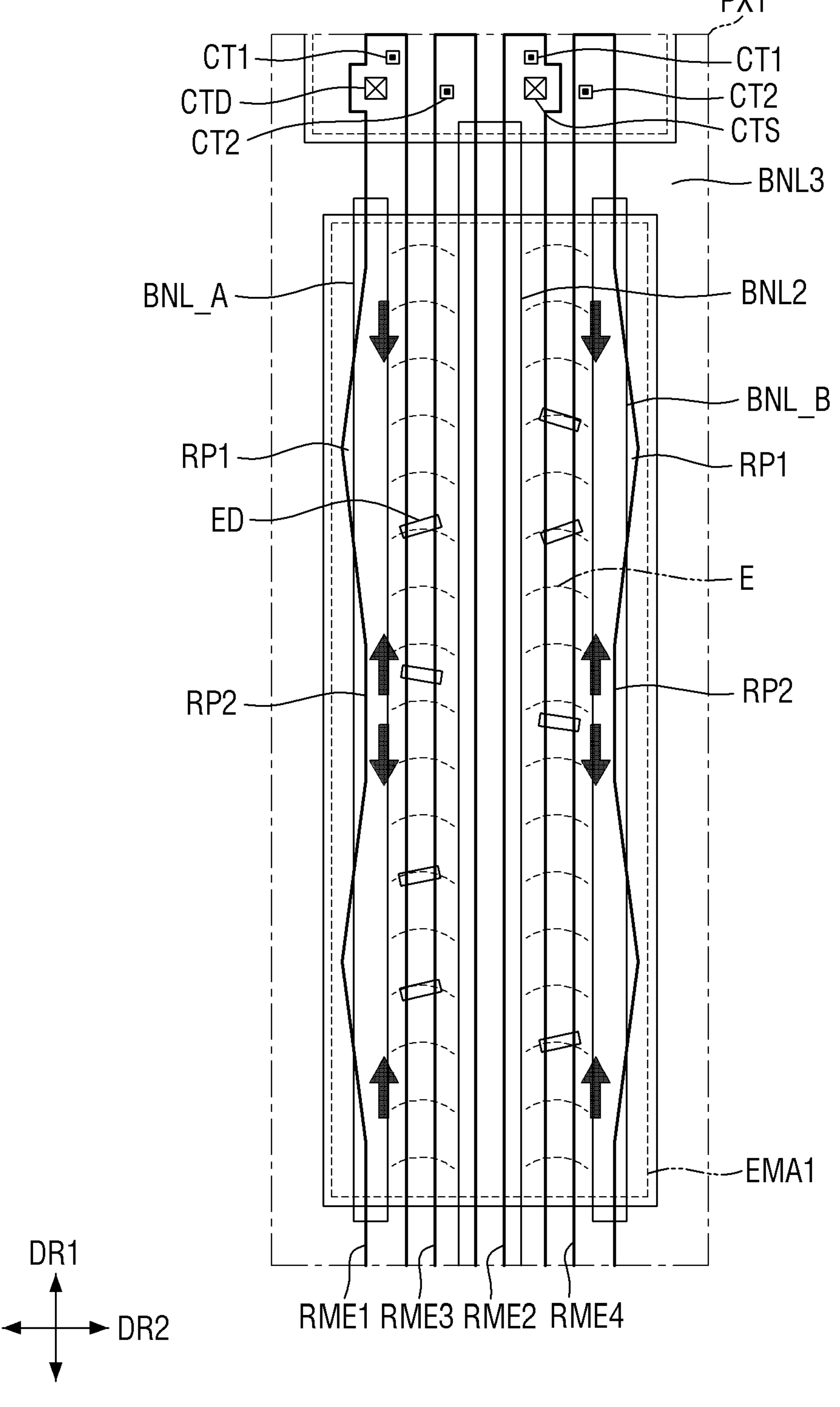
Figure 12:
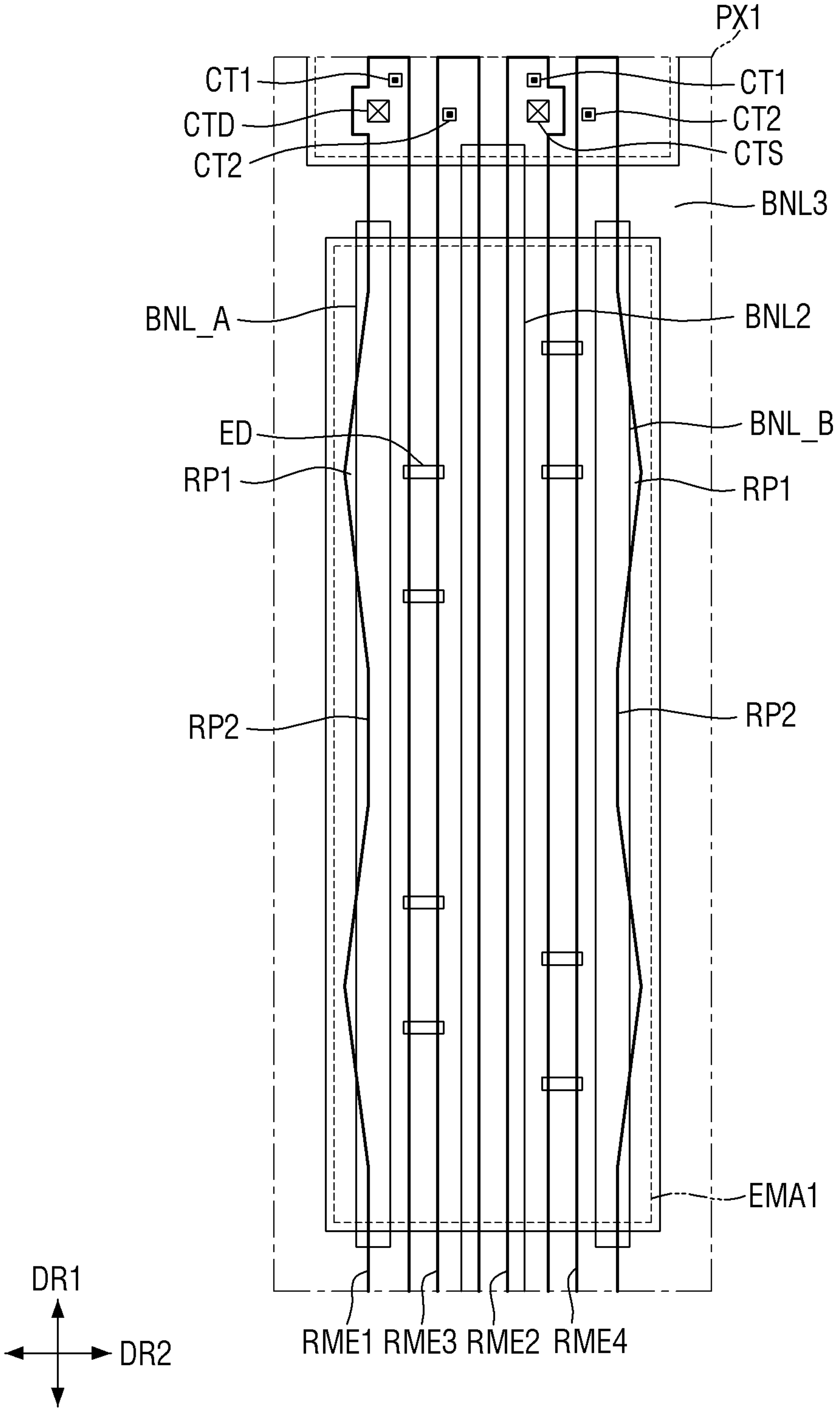

Next, referring to FIGS. 10-12, ink containing the light emitting elements ED is sprayed in the emission area EMA, and the electric field E is generated between the adjacent electrodes to arrange the light emitting elements ED. When electrical signals are applied to the electrodes RME1, RME2, RME3, and RME4 spaced from each other, the electric field E directed in a specific direction is generated between the electrodes. The light emitting element ED including semiconductor layers doped with different conductivity types may have intramolecular interaction, (e.g., dipole-dipole interaction), and may be disposed on the electrodes by a dielectrophoretic force induced by the electric field E in ink.

Each electrical signal applied to the electrode may have a specific sign (e.g., a positive sign or a negative sign), and the electrical signal may generate induced charge on solvent molecules of the ink located right above the electrode. An electrical force may act on the solvent molecules charged similarly to the light emitting element ED by the electric field E. Accordingly, the electric field E generated between the electrodes may change the position and the orientation of the dipolar light emitting element ED, and also may cause flow of droplets in which the solvent molecules of the ink with induced charge are directed in a specific direction.

Here, when the width of the electrode varies depending on positions, the ink flow may also be directed in a specific direction. For example, a stronger force may act on the solvent molecules of the ink at a portion having a relatively large width, and the ink may flow on the electrode from a portion of the electrode having a small width toward a portion of the electrode having a large width. Accordingly, the light emitting element ED dispersed in the ink may be arranged on the electrodes by the electric field E and may be guided to move toward the portion having a large width by the ink flow.

The display device 10 according to one embodiment may include the electrodes RME1, RME2, RME3, and RME4 having different widths depending on positions, so that the ink flow may be generated and the light emitting elements ED may be arranged. When the ink in which the light emitting elements ED are dispersed is sprayed in the emission area EMA and the electric field E is generated, the ink may flow from the second portions RP2 of the electrodes RME1 and RME4 toward the first portions RP1 having a large width, and the light emitting elements ED may be guided to face the first portions RP1 of the electrodes RME1 and RME4 by the ink flow.

Accordingly, the light emitting elements ED may be densely arranged in a specific location compared to the arrangement process using only the electric field E. The light emitting elements ED may be mostly arranged on the first portions RP1 of the electrodes RME1 and RME4, and may be sparsely arranged on the second portions RP2. The display device 10 may reduce the number of the light emitting elements ED that are arranged in an undesired area and lost and may relieve aggregation or agglomeration of the dipolar light emitting elements ED in ink to a certain extent by the flow. For example, it is possible to form the plurality of light emitting element groups ED #1 and ED #2 depending on the position of the first portion RP1, and also possible to improve brightness per unit area of the sub-pixel PXn by connecting the plurality of light emitting elements groups ED #1 and ED #2 in series in one sub-pixel PXn.

Hereinafter, other embodiments of the display device 10 will be described with reference to other drawings.

Figure 13:
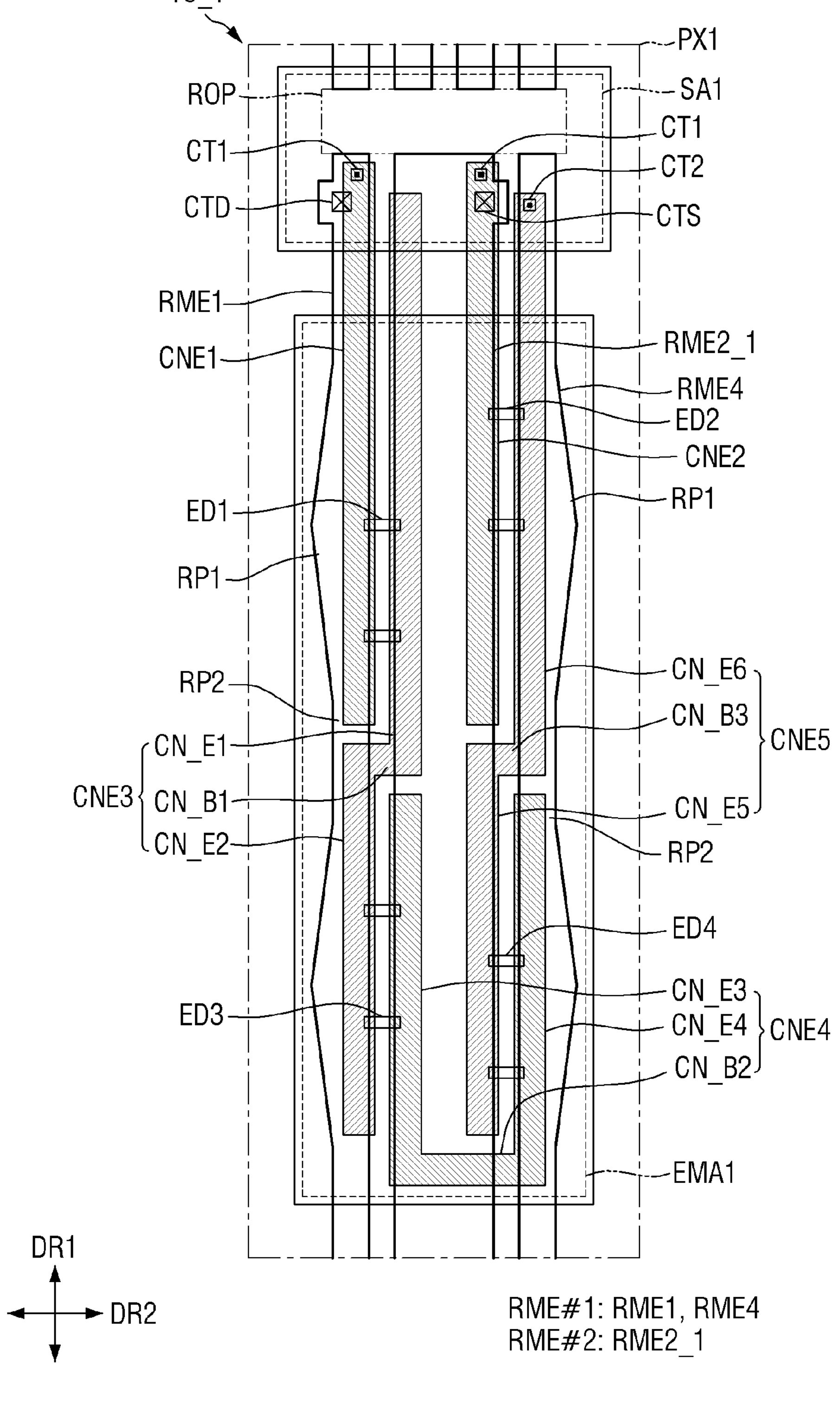
FIGS. 13 and 14 are plan views illustrating a sub-pixel of a display device according to an embodiment.
Figure 14:
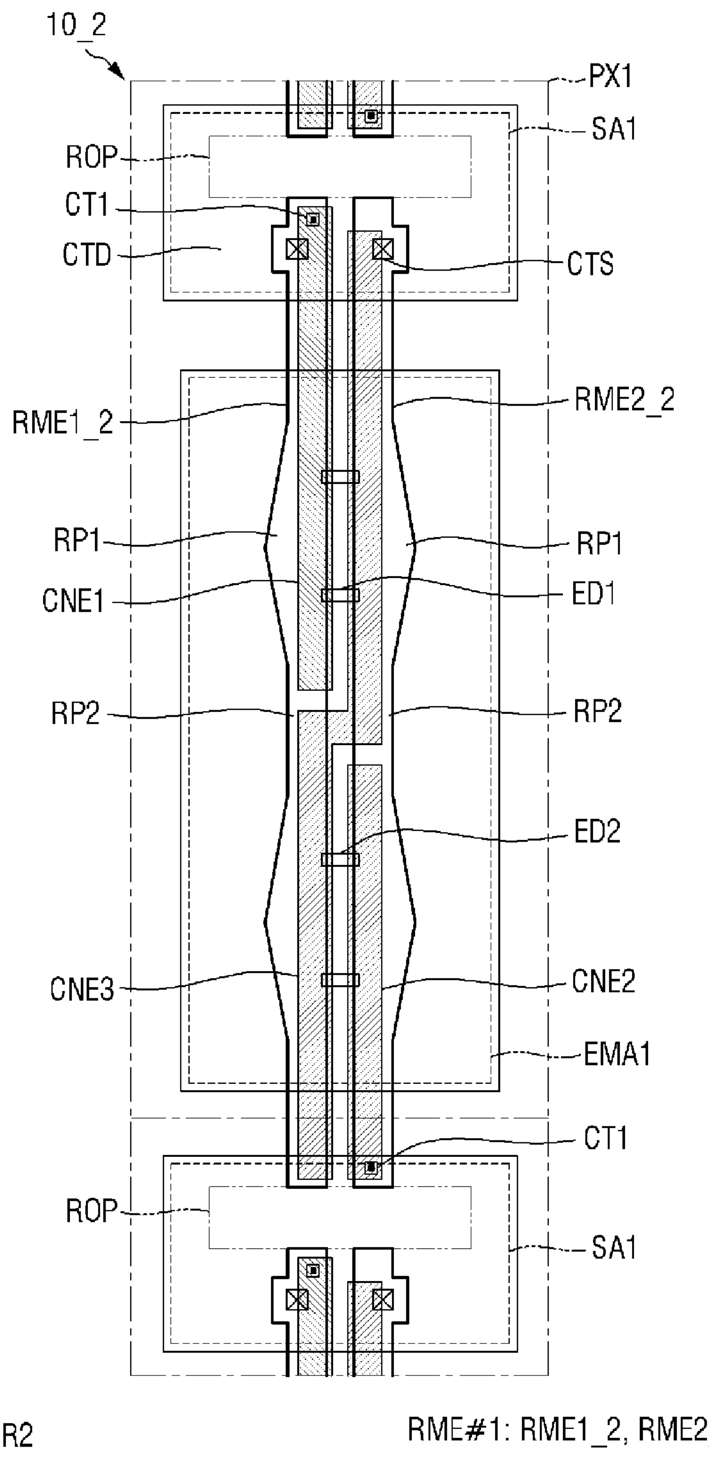

FIGS. 13 and 14 are plan views illustrating a sub-pixel of a display device according to an embodiment. In FIGS. 13 and 14, in order to explain various shapes of the plurality of electrodes RME, the illustration of the first bank BNL1 and the second bank BNL2 arranged thereunder is omitted.

Referring to FIG. 13, in a display device 10_1 according to one embodiment, the second type electrodes RME #2 (e.g., RME 2 and RME 3 of FIG. 3) adjacent to each other may be integrated to form one electrode. A second electrode RME2_1 that is the second type electrode RME #2 may be disposed to cover both sides of the second bank BNL2, and may have a larger width than the second portion RP2 of the first type electrode RME #1. The described embodiment is different from the embodiment of FIG. 3 in that the second electrode RME2 and the third electrode RME3 of FIG. 3 are integrated to form one second type electrode RME #2.

The second electrode RME2_1 that is the second type electrode RME #2 may have one side facing the first electrode RME1 and the other side facing the fourth electrode RME4. Any one end of each of the plurality of light emitting elements ED may be disposed on the second electrode RME2_1.

The second electrode RME2_1 may be in contact with only the second contact electrode CNE2 through the first contact portion CT1 formed in the sub-area SA, and the third contact electrode CNE3, the fourth contact electrode CNE4, and the fifth contact electrode CNE5 whose extension portions are arranged on the second electrode RME2_1 may not be directly connected to the second electrode RME2_1. Accordingly, it is possible to prevent the contact electrodes CNE from being electrically short-circuited by the second electrode RME2_1.

In the embodiment including the second type electrodes RME #2 separated from each other, the second type electrodes RME #2 of the display device 10 may be formed from one connected electrode in the fabricating process. Because the electric signals of the same sign are applied to the second type electrodes RME #2, the second type electrodes RME #2 may be integrally formed without being separated from each other. The display device 10_1 according to one embodiment may have a three-electrode structure including the first electrode RME1 and the fourth electrode RME4 that are the first type electrodes RME #1, and one second electrode RME2_1 facing the first electrode RME1 and the fourth electrode RME4 while being spaced from them. The light emitting elements ED may be densely arranged on the portion of the second electrode RME2_1 facing the first portion RP1 of the first type electrode RME #1, and may be connected in series through the contact electrode CNE.

Referring to FIG. 14, a display device 10_2 according to one embodiment may not include the second type electrodes RME #2, and may include only the first type electrodes RME #1 facing each other. The display device 10_2 may include, as the first type electrodes RME #1, a first electrode RME1_2 and a second electrode RME2_2, each having a first portion RP1 and a second portion RP2. The first electrode RME1_2 and the second electrode RME2_2 may have a symmetrical structure, and the first portions RP1 thereof may face each other.

Accordingly, most of the plurality of light emitting elements ED may be arranged such that both ends thereof are disposed on the first portions RP1 of the first electrode RME1_2 and the second electrode RME2_2. The light emitting element ED may include the first light emitting element ED1 disposed on the first portions RP1 located above the center of the emission area EMA and the second light emitting element ED2 disposed on the second portions RP2 located below the center of the emission area EMA. The first light emitting element ED1 may form a first light emitting element group, and the second light emitting element ED2 may form a second light emitting element group. The first and second light emitting groups may be spaced from each other in the first direction DR1.

The contact electrode CNE may include only the first contact electrode CNE1, the second contact electrode CNE2, and the third contact electrode CNE3, and the first light emitting element ED1 and the second light emitting element ED2 may be connected in series through the third contact electrode CNE3. The first contact electrode CNE1 may be connected to the first electrode RME1 through the first contact portion CT1 formed in the sub-area SA of the corresponding sub-pixel PXn, and the second contact electrode CNE2 may be connected to the second electrode RME2 through the first contact portion CT1 formed in the sub-area SA of another sub-pixel PXn adjacent thereto in the first direction DR1. The third contact electrode CNE3 may not be directly connected to the electrodes RME. Because most of the light emitting elements ED are arranged on the first portions RP1 of the electrodes RME, the connection portion of the third contact electrode CNE3 may be disposed on the second portions RP2 of the electrodes RME.

The display device 10_2 may include the light emitting elements ED connected in a two-stage series structure that includes only the first type electrodes RME #1 without including the second type electrode RME #2.

Figure 15:
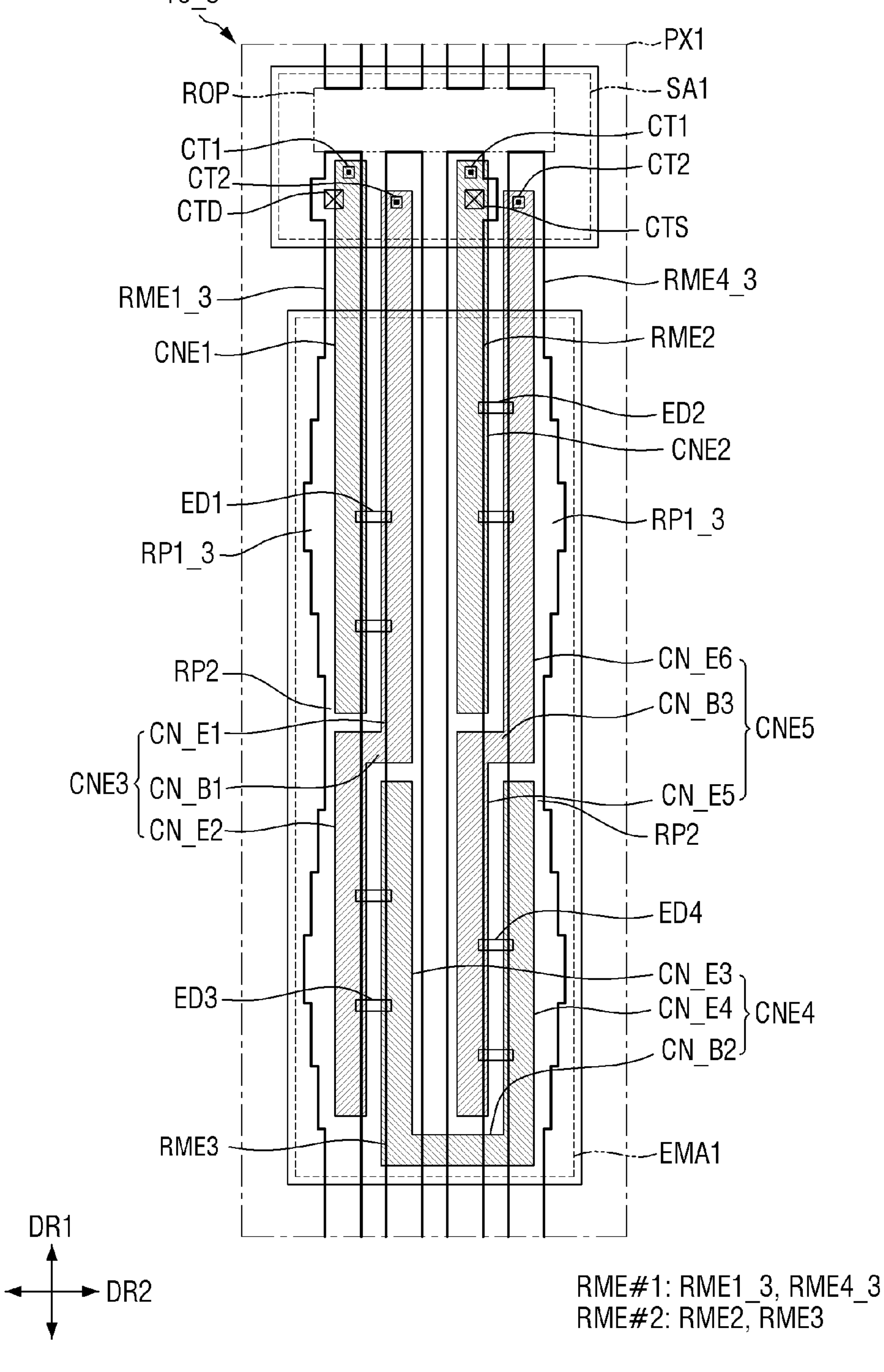
FIG. 15 is a plan view illustrating a sub-pixel of a display device according to an embodiment.

FIG. 15 is a plan view illustrating a sub-pixel of a display device according to an embodiment.

Referring to FIG. 15, in a display device 10_3 according to one embodiment, the outer side of the first portion RP1 of the first type electrode RME #1 may have a partially protruding shape. Unlike the embodiment of FIG. 3, the outer side of the first portion RP1 of the first type electrode RME #1 may extend in the first direction DR1 without being inclined, and may partially protrude in the second direction DR2. Accordingly, the first portion RP1 of the first type electrode RME #1 may include a plurality of parts having different widths, and the outer sides of the first type electrode RME #1 may extend in parallel to each other even if the width varies depending on positions. Regardless of the shape of the first portion RP1 of the first type electrode RME #1, the first portion RP1 has a larger width than the second portion RP2, so that it is possible to form flow of ink containing the light emitting elements ED, as described with respect to FIG. 11. The described embodiment is different from the embodiment of FIG. 3 in that the shape of the first type electrode RME #1 is different.

On the other hand, in order to guide the flow of ink containing the light emitting elements ED, it is possible to change, not the structure of the electrode RME, but the structure of the first bank BNL1 or the second bank BNL2 disposed thereunder.

Figure 16:
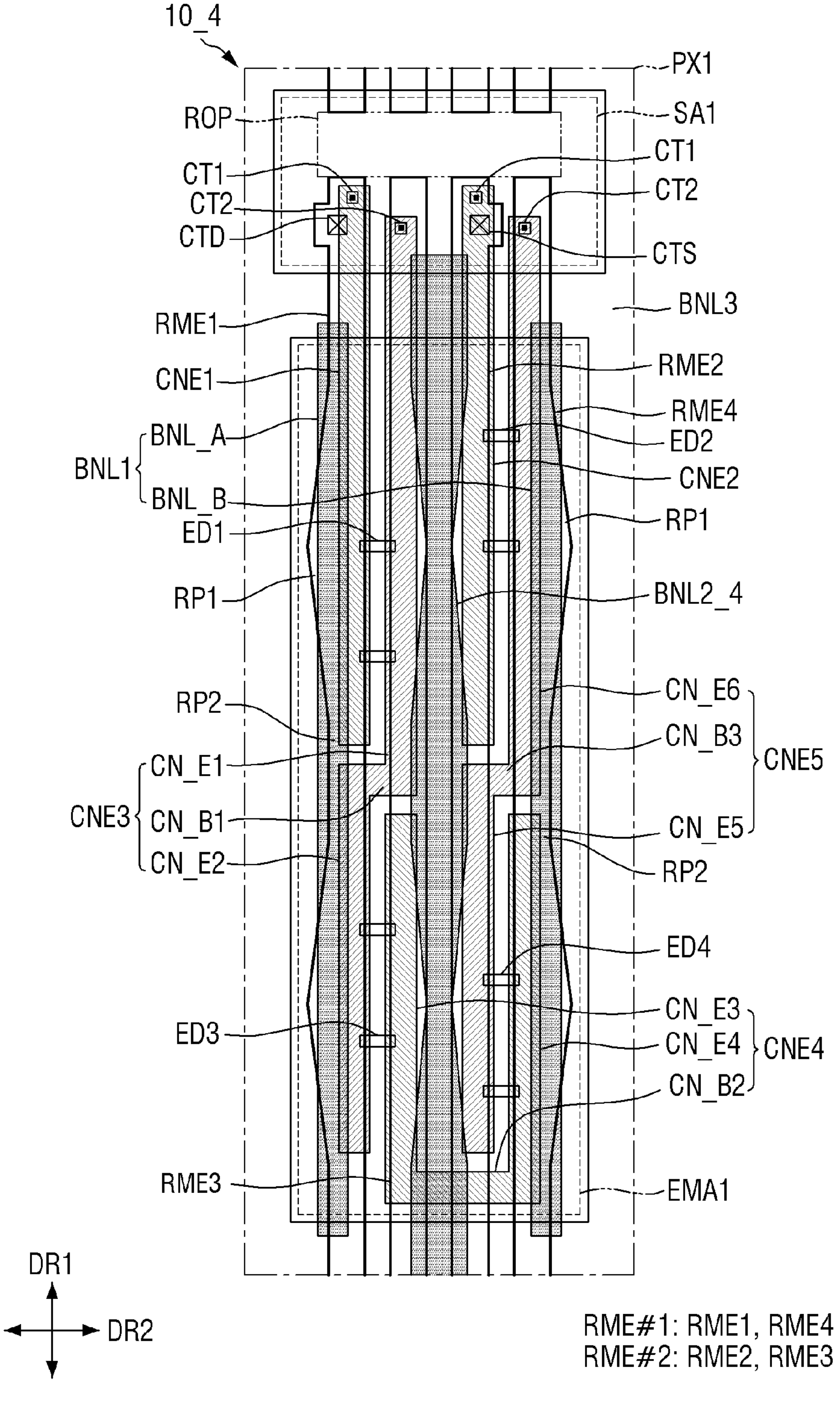
FIG. 16 is a plan view illustrating a sub-pixel of a display device according to an embodiment.
Figure 17:
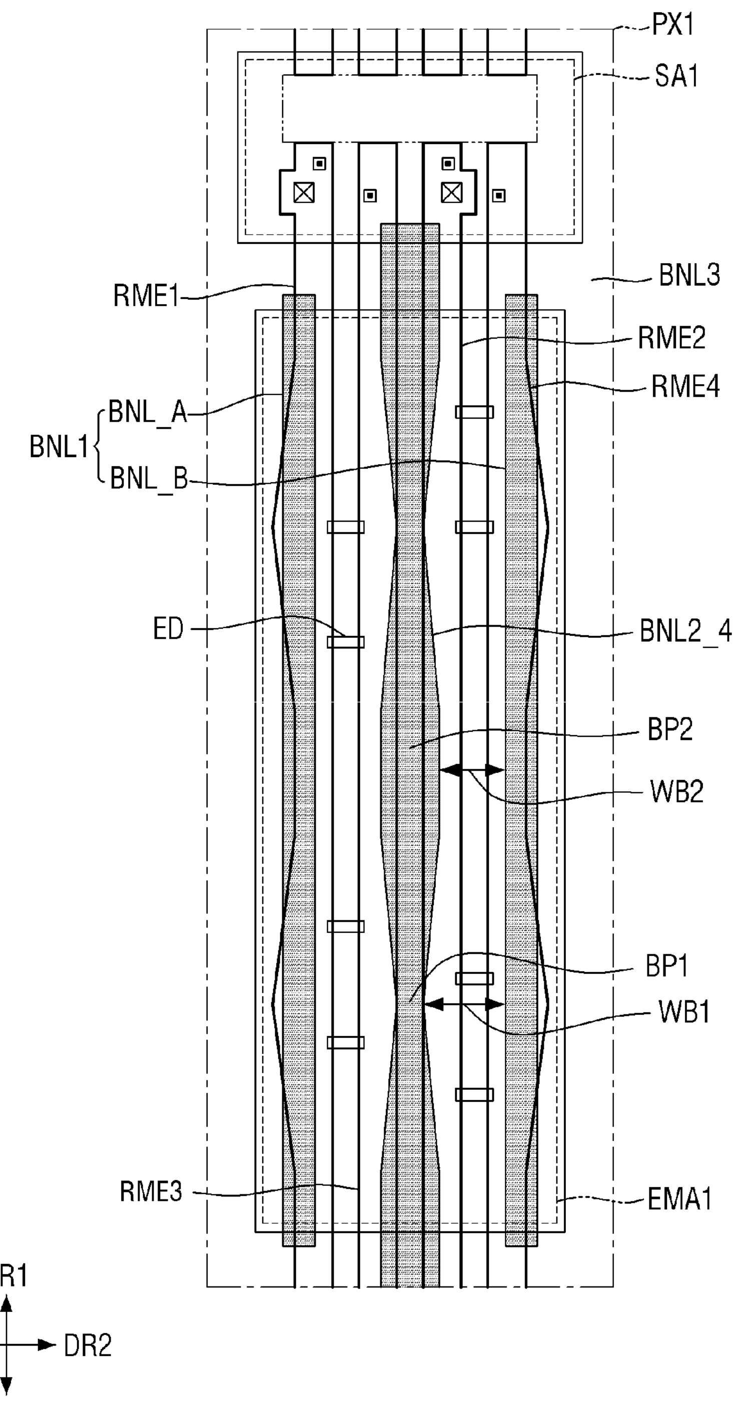
FIG. 17 is a plan view showing electrodes and banks disposed on one sub-pixel of the display device of FIG. 16.

FIG. 16 is a plan view illustrating a sub-pixel of a display device according to an embodiment. FIG. 17 is a plan view showing electrodes and banks disposed on one sub-pixel of the display device of FIG. 16. In FIG. 17, in order to explain the shapes of the first bank BNL1 and a second bank BNL2_4, the illustration of the contact electrodes CNE is omitted.

Referring to FIGS. 16 and 17, in a display device 10_4 according to one embodiment, the second bank BNL2_4 disposed below the second electrode RME2 and the third electrode RME3 that are the second type electrodes RME #2 may include bank portions BP1 and BP2 having different widths. The second bank BNL2_4 may include the first bank portion BP1 having a relatively small width and disposed at a portion of the second type electrode RME #2 facing the first portion RP1 of the first type electrode RME #1, and the second bank portion BP2 having a larger width than the first bank portion BP1. The second bank portion BP2 may be disposed at a portion of the second type electrode RME #2 facing the second portion RP2 of the first type electrode RME #1. For example, the first bank portion BP1 may overlap the portions of the second electrode RME2 and the third electrode RME3 facing the first portions RP1 of the first electrode RME1 and the fourth electrode RME4, and the second bank portion BP2 may overlap the portions of the second electrode RME2 and the third electrode RME3 facing the second portions RP2 of the first electrode RME1 and the fourth electrode RME4. The second bank BNL2_4 according to the described embodiment is different from the second bank BNL2 of FIG. 3 in that it further includes the first bank portion BP1 partially having a small width. The second bank portion BP2 of the second bank BNL2_4 may have the same width as that of the second bank BNL2 of FIG. 3.

The second bank BNL2_4 may include the first bank portions BP1 having a small width due to inwardly depressed both sides facing the first bank BNL1. The outer sides of the first bank portion BP1 may have an inclined shape, and may have a shape in which a width thereof gradually decreases from the second bank portion BP2. A first distance WB1 between the narrowest portion of the first bank portion BP1 and the first bank BNL1 may be greater than a second distance WB2 between the second bank portion BP2 and the first bank BNL1. In the display device 10_4, the distances WB1 and WB2 between the first bank BNL1 and the second bank BNL2_4 may be adjusted to generate ink flow and arrange the light emitting elements ED in a specific location.

Because the first bank BNL1 and the second bank BNL2_4 have a protruding shape on the third interlayer insulating layer IL3, the area therebetween may form a valley portion with respect to the top surfaces of the first bank BNL1 and the second bank BNL2_4. Because the second bank BNL2_4 includes the first bank portion BP1 and the second bank portion BP2 having different widths, the distance between the first bank BNL1 and the second bank BNL2_4 or the width of the valley portion formed by the first bank BNL1 and the second band BNL2_4 may vary depending on positions. The first bank portion BP1 may be located on both sides in the first direction DR1 with respect to the second bank portion BP2 of the second bank BNL2_4, and the second type electrode RME #2 disposed on the second bank portion BNL2_4 may include a portion whose height decreases toward the first direction DR1 from the second bank portion BP2. For example, the portion of the second type electrode RME #2 disposed on the second bank portion BP2 may extend in the first direction DR1, so that a part of the second type electrode RME #2 may be disposed on the first bank portion BR1 and another part of the second type electrode RME #2 may be directly disposed on the third interlayer insulating layer IL3 where the second bank BNL2_4 is not disposed. The second type electrode RME #2 may include the portion disposed on the second bank portion BP2 and the portion directly disposed on the third interlayer insulating layer IL3 on the side surface of the first bank portion BP1, and a height difference may occur therebetween depending on whether or not the second bank BNL2_4 is disposed. The ink containing the light emitting elements ED may flow toward the first bank portion BP1 due to the height difference of the second type electrode RME #2 and the distances WB1 and WB2 between the first bank BNL1 and the second bank BNL2_4. The light emitting elements ED may be guided to be arranged on the portion of the second type electrode RME #2 disposed on the first bank portion BP1 by the ink flow as well as the electric field E.

The display device 10_4 may include the second bank BNL2_4 having portions with different widths depending on positions, as well as the electrode (e.g., the first type electrode RME #1) having portions with different widths depending on positions, so that the light emitting elements ED may be concentrated in a specific location.

Figure 18:
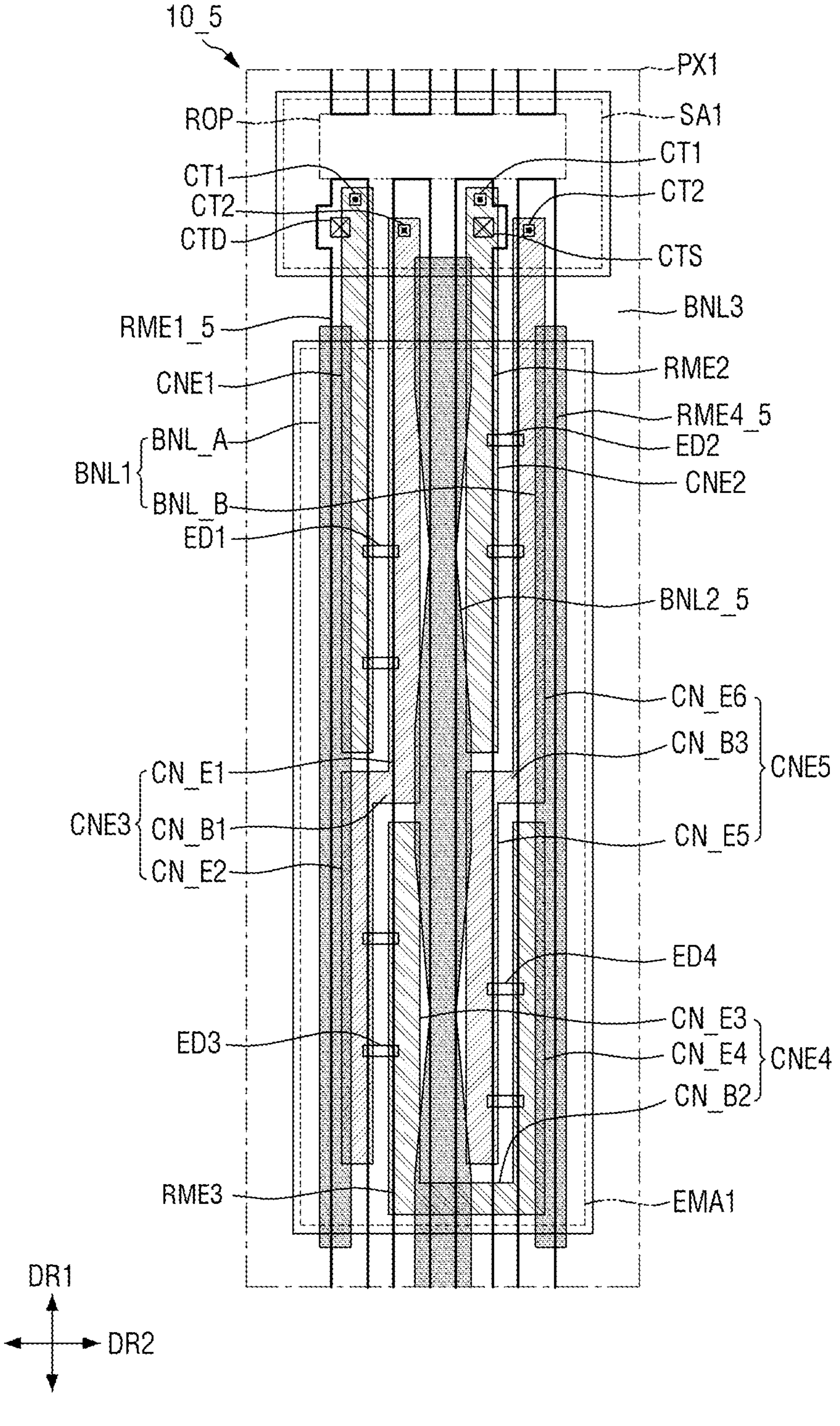
FIG. 18 is a plan view illustrating a sub-pixel of a display device according to an embodiment.

FIG. 18 is a plan view illustrating a sub-pixel of a display device according to an embodiment.

Referring to FIG. 18, in a display device 10_5 according to one embodiment, the plurality of electrodes RME are the second type electrodes RME #2 having a constant width, and a second bank BNL2_5 disposed below the second electrode RME2 and the third electrode RME3 may include a first bank portion BP1 and a second bank portion BP2 having different widths. The described embodiment is different from the embodiment of FIG. 16 in that the shape of the electrode RME is different. Unlike the embodiment of FIG. 16, a first electrode RME1_5 and a fourth electrode RME4_5 may have a constant width, similarly to the second type electrode RME #2, without including the first portion RP1 having a large width. By adjusting the width of the second bank BNL2_5 where the electrodes RME are arranged, ink flow may be generated and the arrangement of the light emitting elements ED may be guided.

On the other hand, the shapes of the banks BNL1 and BNL2 arranged below the electrodes RME are not limited those illustrated in FIGS. 16-18.

Figure 19:
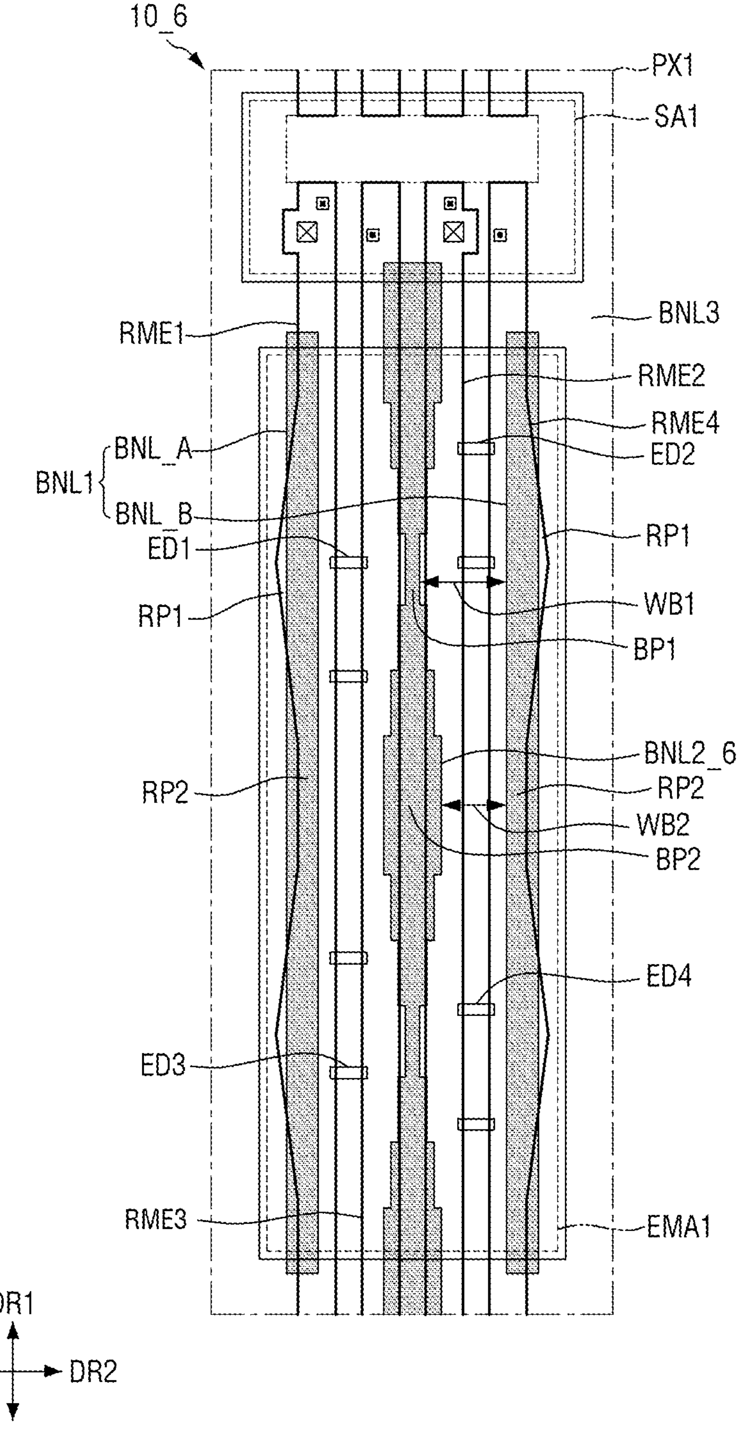
FIGS. 19 and 20 are plan views showing electrodes and banks disposed on one sub-pixel of a display device according to an embodiment.
Figure 20:
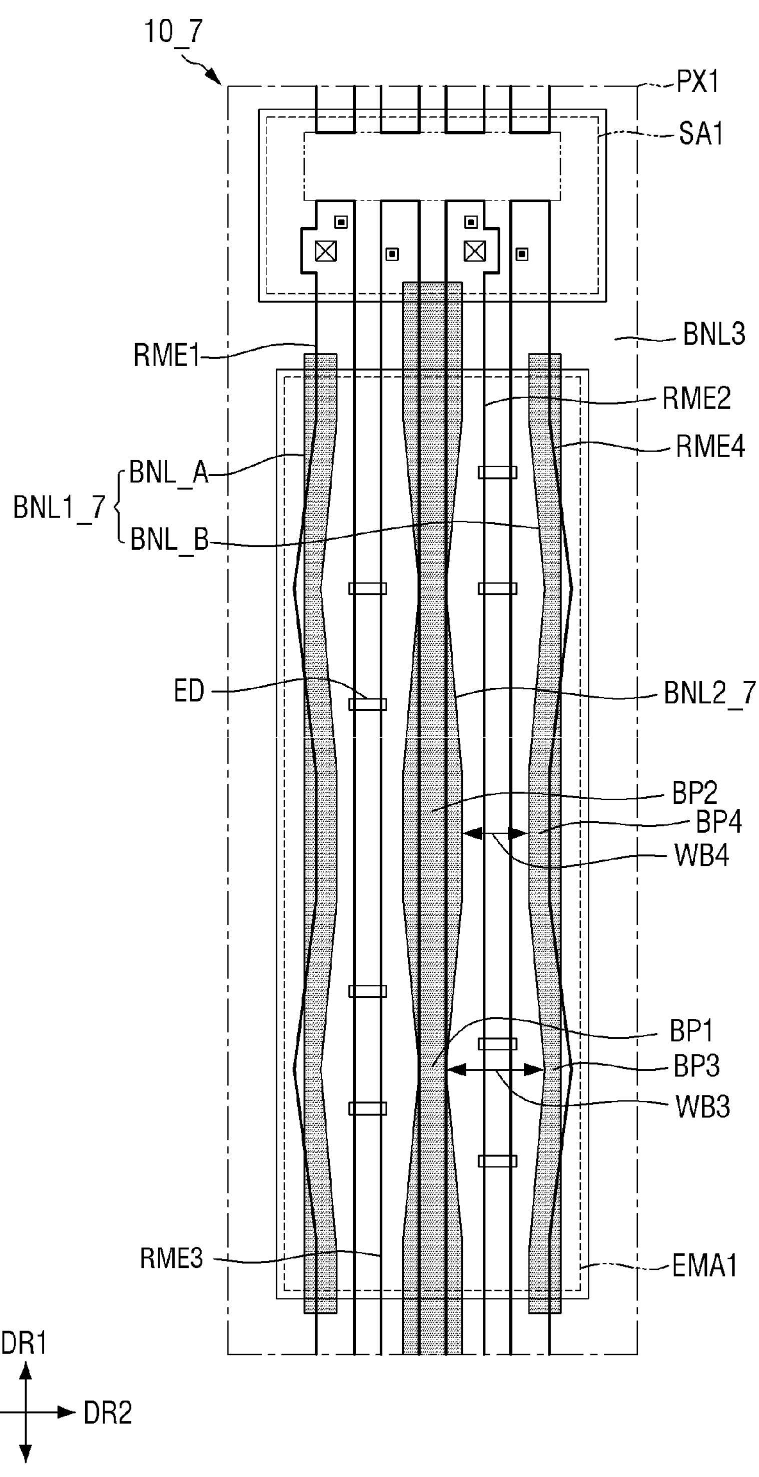

FIGS. 19 and 20 are plan views showing electrodes and banks disposed on one sub-pixel of a display device according to an embodiment.

Referring to FIG. 19, in a display device 10_6 according to one embodiment, an outer side of a first bank portion BP1 of a second bank BNL2_6 may have a partially depressed shape. Unlike the embodiment of FIG. 16, the outer side of the first bank portion BP1 of the second bank BNL2_6 may extend in the first direction DR1 without being inclined, and may be partially depressed in the direction DR2. Accordingly, the first bank portion BP1 (and the second bank portion BP2) of the second bank BNL2_6 may include a plurality of parts having different widths, and the outer sides of the second bank BNL2_6 may extend in parallel to each other even if the width varies depending on positions. The described embodiment is different from the embodiment of FIG. 16 in that the shape of the second bank BNL2_6 is different.

Referring to FIG. 20, in a display device 10_7 according to one embodiment, a first bank BNL1_7 as well as a second bank BNL2_7 may include bank portions BP3 and BP4 having different widths. The first bank BNL1_7 may include the third bank portion BP3 having a small width corresponding to the portion where the first portion RP1 of the first type electrode RME #1 is disposed, and the fourth bank portion BP4 having a larger width than the third bank portion BP3. The third bank portion BP3 of the first bank BNL1_7 may be spaced from the first bank portion BP1 of the second bank BNL2_7 in the second direction DR2, and the fourth bank portion BP4 of the first bank BNL1_7 may be spaced from the second bank portion BP2 in the second direction DR2. The inner sides of the first bank BNL1_7 facing the second bank BNL2_7 may be partially depressed, whereas the outer sides on the opposite side may extend in the first direction DR1 without being depressed. Unlike the second bank BNL2_7 where both sides are depressed to form the first bank portion BP1, only the inner sides of the first bank BNL1_7 facing the second bank BNL2_7 are inclined and depressed, and the outer sides of the third bank portion BP3 and the fourth bank portion BP4 may be aligned in the first direction DR1. A third distance WB3 between the third bank portion BP3 of the first bank BNL1_7 and the first bank portion BP1 of the second bank BNL2_7 may be smaller than a fourth distance WB4 between the fourth bank portion BP4 and the second bank portion BP2. The described embodiment is different from the embodiment of FIG. 16 in that the first bank BNL1_7 includes the third bank portion BP3 and the fourth bank portion BP4.

On the other hand, the display device 10 may further include a structure or layers arranged on the third bank BNL3 and the light emitting element ED to control the color of the light emitted from each sub-pixel PXn. The structure and the layers may be arranged in a specific location in the emission area EMA to correspond to the shape of the electrodes RME and the arrangement of the light emitting elements ED of the display device 10.

Figure 21:
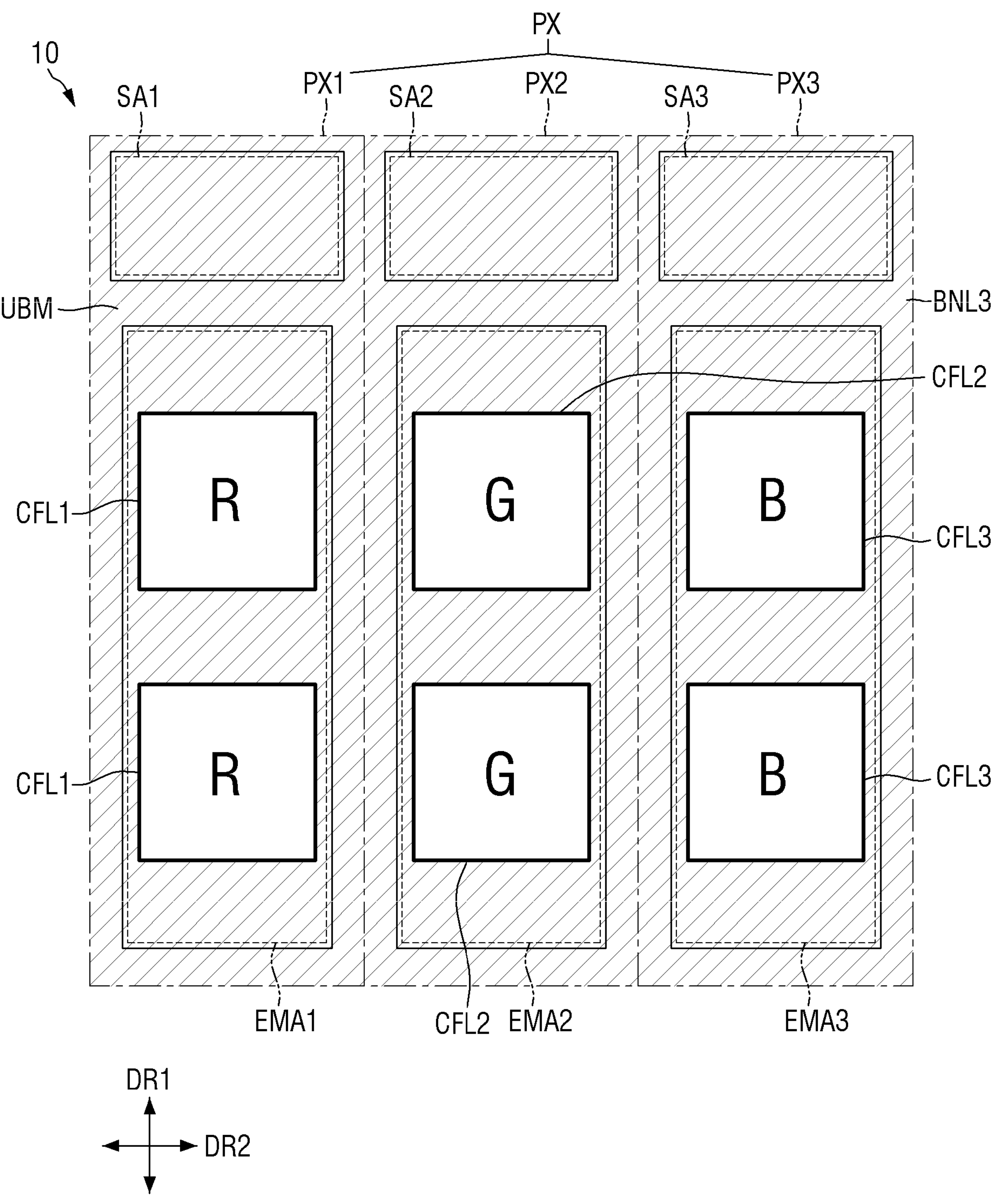
FIG. 21 is a plan view showing a color filter layer disposed in one pixel of a display device according to one embodiment.
Figure 22:
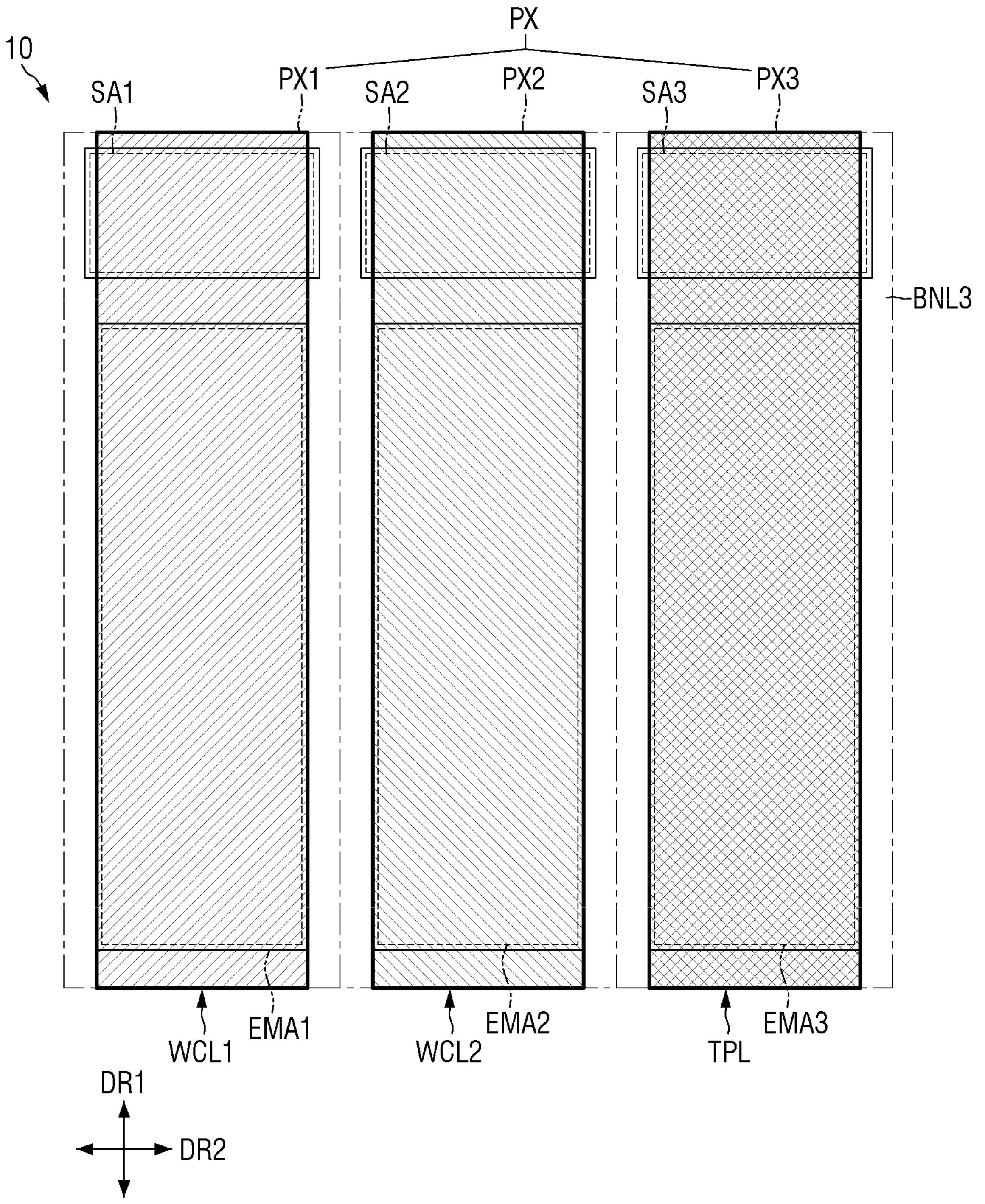
FIG. 22 is a plan view showing a color control structure disposed in one pixel of a display device.
Figure 23:
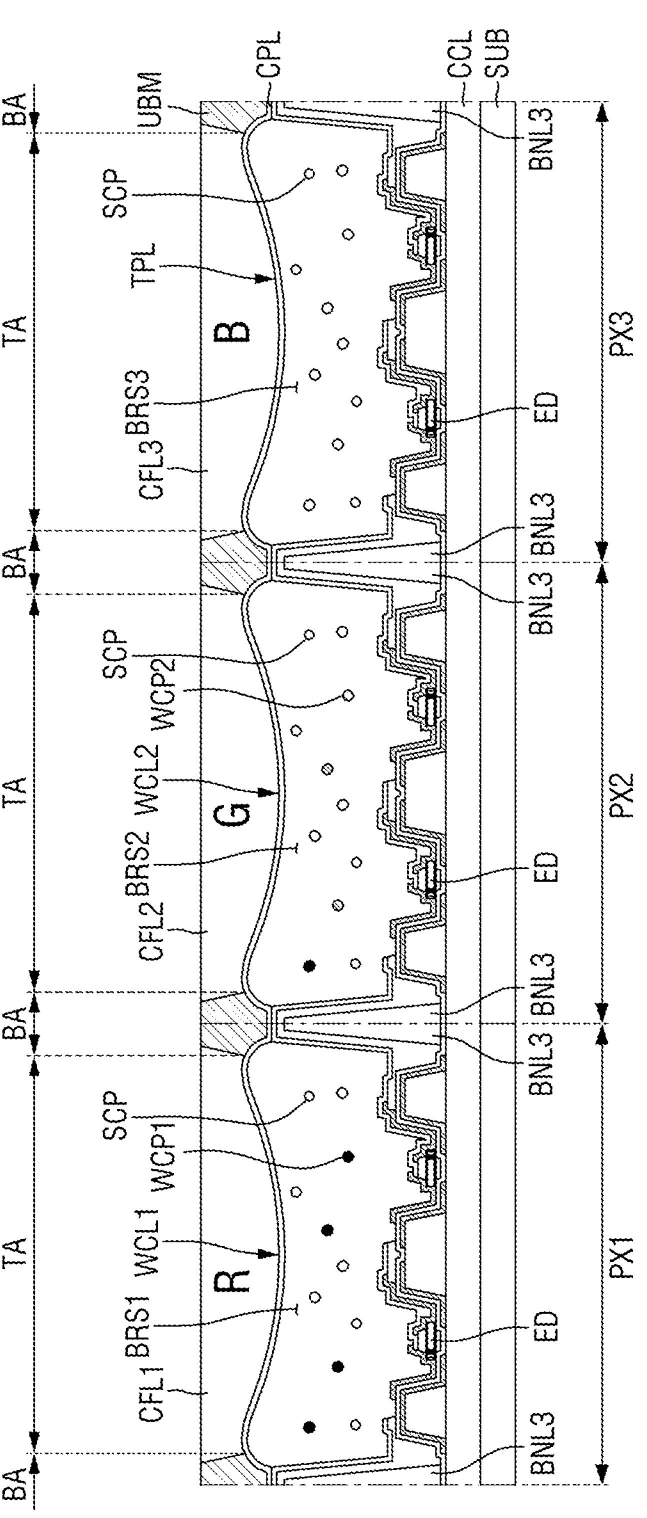
FIG. 23 is a schematic cross-sectional view showing a color control structure and a color filter layer arranged in one pixel of a display device according to one embodiment.
Figure 24:
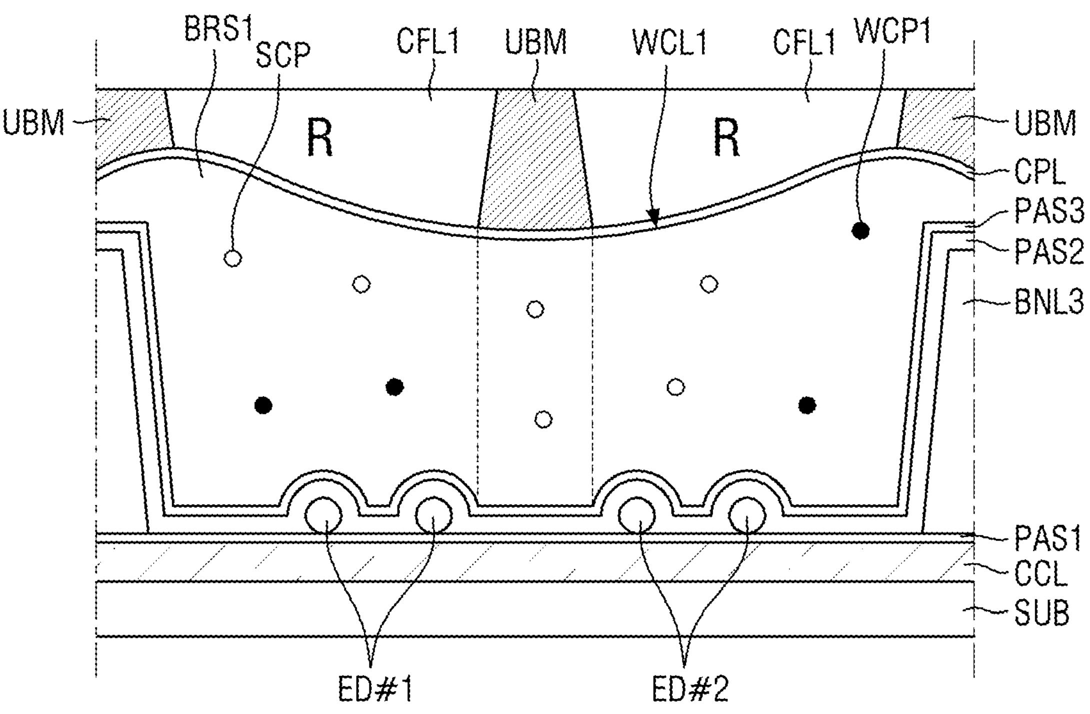
FIG. 24 is a cross-sectional view across one sub-pixel of a display device according to one embodiment.

FIG. 21 is a plan view showing a color filter layer disposed in one pixel of a display device according to one embodiment. FIG. 22 is a plan view showing a color control structure disposed in one pixel of a display device. FIG. 23 is a schematic cross-sectional view showing a color control structure and a color filter layer arranged in one pixel of a display device according to one embodiment. FIG. 24 is a cross-sectional view across one sub-pixel of a display device according to one embodiment. FIG. 23 shows a cross section across the plurality of sub-pixels PXn in the second direction DR2 to illustrate color control structures TPL, WCL1, and WCL2 and the structures of color filter layers CFL1, CFL2, and CFL3. FIG. 24 shows a cross section across the plurality of light emitting element groups ED #1 and ED #2 arranged in one sub-pixel PXn in the first direction DR1.

Referring to FIGS. 21-23, the display device 10 according to one embodiment may further include the color control structures TPL, WCL1, and WLC2 and the plurality of color filter layers CFL1, CFL2, and CFL3 arranged on the light emitting elements ED. Because the display device 10 further includes the color control structures TPL, WCL1, and WCL2 and the color filter layers CFL1, CFL2, and CFL3, it is possible to emit lights of different colors even if each sub-pixel PXn includes the same type of light emitting elements ED.

The display device 10 may include a plurality of light transmitting areas TA where the color filter layers CFL1, CFL2, and CFL3 are disposed and light is emitted, and a light blocking area BA where no light is emitted between the light transmitting areas TA. The light transmitting area TA may be located to correspond to a part of the emission area EMA of each sub-pixel PXn, and the light blocking area BA may be an area other than the light transmitting area TA. As will be described later, the light transmitting area TA and the light blocking area BA may be distinguished by a first light blocking member UBM.

The color control structures TPL, WCL1, and WCL2 may be arranged on the light emitting element ED. The color control structures TPL, WCL1, and WCL2 may be arranged in the region surrounded by the third bank BNL3. However, the color control structures TPL, WCL1, and WCL2 may extend in the first direction DR1 in a plan view over the third bank BNL3. The color control structures TPL, WCL1, and WCL2 may be arranged on the portion of the third bank BNL3 extending in the second direction DR2 as well as the emission area EMA and the sub-area SA surrounded by the third bank BNL3 to form a linear pattern in the display area DPA. However, the present disclosure is not limited thereto, and the color control structures TPL, WCL1, and WCL2 may be arranged only in the emission area EMA where the light emitting elements ED are arranged to form an island-shaped pattern in the display area DPA.

In the described embodiment in which the light emitting element ED of each sub-pixel PXn emits blue light of the third color, the color control structures TPL, WCL1, and WCL2 may include the first wavelength conversion layer WCL1 disposed in the first sub-pixel PX1, the second wavelength conversion layer WCL2 disposed in the second sub-pixel PX2, and the light transmitting layer TPL disposed in the third sub-pixel PX3.

The first wavelength conversion layer WCL1 may include a first base resin BRS1 and a first wavelength conversion material WCP1 provided in the first base resin BRS1. The second wavelength conversion layer WCL2 may include a second base resin BRS2 and a second wavelength conversion material WCP2 provided in the second base resin BRS2. The first wavelength conversion layer WCL1 and the second wavelength conversion layer WCL2 may transmit the blue light of the third color incident from the light emitting element ED while converting the wavelength thereof. The first wavelength conversion layer WCL1 and the second wavelength conversion layer WCL2 may further include a scatterer SCP contained in each base resin, and the scatterer SCP may increase wavelength conversion efficiency.

The light transmitting layer TPL may include a third base resin BRS3 and the scatterer SCP contained in the third base resin BSR3. The light transmitting layer TPL transmits the blue light of the third color incident from the light emitting element ED while maintaining the wavelength thereof. The scatterers SCP of the light transmitting layer TPL may serve to control an emission path of the light emitted through the light transmitting layer TPL. The light transmitting layer TPL may not include a wavelength conversion material.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin or the like. The first to third base resins BRS1, BRS2 and BRS3 may be formed of the same material, but the present disclosure is not limited thereto.

The first wavelength conversion material WCP1 may convert the blue light of the third color into the red light of the first color, and the second wavelength conversion material WCP2 may convert the blue light of the third color into the green light of the second color. The first wavelength conversion material WCP1 and the second wavelength conversion material WCP2 may be quantum dots, quantum bars, phosphors or the like. Examples of the quantum dot may include Group IV nanocrystal, Groups II-VI compound nanocrystal, Groups III-V compound nanocrystal, Groups IV-VI nanocrystal, and a combination thereof.

The color control structures TPL, WCL1, and WCL2 may be directly arranged on the third insulating layer PAS3. In the display device 10, the third bank BNL3 may be disposed to surround some areas with a suitable height (e.g., a predetermined height), so that the base resins BRS1, BRS2, and BRS3 of the color control structures TPL, WCL1, and WCL2 may be arranged directly on the light emitting element ED and the third insulating layer PAS3 disposed thereon. The scatterers SCP and the wavelength conversion materials WCP1 and WCP2 of the color control structures TPL, WCL1, and WCL2 may be arranged around the light emitting element ED in each of the base resins BRS1, BRS2, and BRS3.

The light emitting element ED of each sub-pixel PXn may emit the blue light of the same third color, and the sub-pixels PXn may emit lights of different colors. For example, the light emitted from the light emitting element ED disposed in the first sub-pixel PX1 is incident on the first wavelength conversion layer WCL1, the light emitted from the light emitting element ED disposed in the second sub-pixel PX2 is incident on the second wavelength conversion layer WCL2, and the light emitted from the light emitting element ED disposed in the third sub-pixel PX3 is incident on the light transmitting layer TPL. The light incident on the first wavelength conversion layer WCL1 may be converted into red light, the light incident on the second wavelength conversion layer WCL2 may be converted into green light, and the light incident on the light transmitting layer TPL may be transmitted as the same blue light without wavelength conversion. Although each sub-pixel PXn contains the light emitting elements ED that emit the light of the same color, the lights of different colors may be emitted depending on the arrangement of the color control structures TPL, WCL1, and WCL2 arranged thereabove.

On the other hand, although the case where the top surfaces of the layers of the color control structures TPL, WCL1, and WCL2 are not flat the edges adjacent to the third bank BNL3 are higher than the central portions is illustrated in the drawing, the disclosure is not limited thereto. The top surfaces of the layers of the color control structures TPL, WCL1, and WCL2 may be flat, or the central portions may be higher unlike the case shown in the drawing.

A capping layer CPL is disposed on the color control structures TPL, WCL1, and WCL2. The capping layer CPL may be disposed to cover the color control structures TPL, WCL1, and WCL2 and the third insulating layer PAS3 on the third bank BNL3. The capping layer CPL may prevent impurities such as moisture or air from permeating from the outside and damaging or contaminating the color control structures TPL, WCL1, and WCL2. Further, the capping layer CPL may prevent the materials of the color control structures TPL, WCL1, and WCL2 from being diffused to other components. The capping layer CPL may be formed of an inorganic material. However, the capping layer CPL may be omitted.

Further, although not shown in FIG. 23, a plurality of layers may be further arranged on the capping layer CPL. For example, a low refractive layer as an optical layer and another capping layer covering the low refractive layer may be arranged between the capping layer CPL and the color filter layers CFL1, CFL2, and CFL3.

The plurality of color filter layers CFL1, CFL2, and CFL3 may contain a colorant such as a dye and a pigment that absorb light of a wavelength band other than a specific wavelength band. The color filter layers CFL1, CFL2, and CFL3 may be arranged for each sub-pixel PXn and may transmit only a part of the light incident on the color filter layers CFL1, CFL2, and CFL3 in the corresponding sub-pixel PXn. Each sub-pixel PXn of the display device 10 may selectively display only the light that has passed through the color filter layers CFL1, CFL2, and CFL3.

The first to third color filter layers CFL1, CFL2, and CFL3 may be arranged directly on the capping layer CPL. Further, a first light blocking member UBM may be further disposed on the capping layer CPL while overlapping the third bank BNL3.

The first light blocking member UBM may be formed in a grid pattern to partially expose one surface of the capping layer CPL. The first light blocking member UBM may be disposed to cover the sub-area SA of each sub-pixel PXn as well as the third bank BNL3 in a plan view, and may be disposed to cover a part of the emission area EMA. In one embodiment, the first light blocking member UBM may be disposed to cover the area of the emission area EMA except the portion where the first portion RP1 of the first type electrode RME #1 is disposed. The area where the first light blocking member UBM is not disposed may be the light transmitting area TA where the color filter layers CFL1, CFL2, and CFL3 are arranged and light is emitted. As described above, the display device 10 includes the first type electrode RME #1 so that the light emitting elements ED may be concentrated in a specific location. The first light blocking member UBM may partially cover the emission area EMA except the area where the first portion RP1 of the first type electrode RME #1 is disposed so that the color filter layers CFL1, CFL2, and CFL3 providing a light emission path may be located to correspond to the area where the light emitting elements ED are located.

Accordingly, a plurality of openings where the first light blocking member UBM is not disposed may be formed in each sub-pixel PXn. For example, the first light blocking member UBM may also be disposed in the area where the second portion RP2 of the first type electrode RME #1 is disposed.

The first light blocking member UBM may contain an organic material. The first light blocking member UBM may reduce color distortion due to reflection of external light by absorbing the external light. In one embodiment, the first light blocking member UBM may absorb all visible light wavelengths. The first light blocking member UBM may contain a light absorbing material. For example, the first light blocking member UBM may be made of a material used as a black matrix of the display device 10.

On the other hand, in some embodiments, the display device 10 may not include the first light blocking member UBM, and the upper light absorbing member UBM may be replaced with a material that absorbs light of a specific wavelength among visible light wavelengths and transmits light of another specific wavelength. The first light blocking member UBM may be replaced with a color pattern containing the same material as at least one of the first to third color filter layers CFL1, CFL2, and CFL3. For example, the color pattern containing the material of any one of the color filter layers or a structure in which a plurality of color patterns are stacked may be disposed in the region where the first light blocking member UBM is disposed. A description thereof may refer to other embodiments.

The first to third color filter layers CFL1, CFL2, and CFL3 are arranged on the capping layer CPL where the first light blocking member UBM is exposed. The different color filter layers CFL1, CFL2, and CFL3 may be spaced from each other with the first light blocking member UBM interposed between, but the present disclosure is not limited thereto. In some embodiments, some of the first to third color filter layers CFL1, CFL2, and CFL3 may be arranged on the first light blocking member UBM and separated from each other on the first light blocking member UBM. In another embodiment, the first to third color filter layers CFL1, CFL2, and CFL3 may partially overlap each other.

The color filter layers CFL1, CFL2, and CFL3 may include a first color filter layer CFL1 disposed in the first sub-pixel PX1, a second color filter layer CFL2 disposed in the second sub-pixel PX2, and a third color filter layer CFL3 disposed in the third sub-pixel PX3. Unlike the color control structures TPL, WCL1, and WCL2, the first to third color filter layers CFL1, CFL2, and CFL3 may be formed in an island-shaped pattern corresponding to the emission area EMA. However, the present disclosure is not limited thereto. The first to third color filter layers CFL1, CFL2, and CFL3 may form a linear pattern in the entire display area DPA.

In an embodiment, the first color filter layer CFL1 may be a red color filter layer, the second color filter layer CFL2 may be a green color filter layer, and the third color filter layer CFL3 may be a blue color filter layer. The lights emitted from the light emitting element ED may be emitted through the color filter layers CFL1, CFL2, and CFL3 while transmitting through the color control structures WCL1, WCL2, and TPL.

The light emitting element ED disposed in the first sub-pixel PX1 may emit the third color light (e.g. blue light), and the light may be incident on the first wavelength conversion layer WCL1. The first base resin BRS1 of the first wavelength conversion layer WCL1 may be made of a transparent material, and a part of the light may be transmitted through the first base resin BRS1 and may be incident on the capping layer CPL disposed thereon. However, at least a part of the light may be incident on the scatterer SCP and the first wavelength conversion material WCP1 arranged in the first base resin BRS1. The light may be scattered and subjected to wavelength conversion, and then may be incident as red light on the capping layer CPL. The lights incident on the capping layer CPL may be incident on the first color filter layer CFL1 while transmitting the capping layer CPL made of a transparent material, and the first color filter layer CFL1 may block the transmission of lights other than red light. Accordingly, the first sub-pixel PX1 may emit the red light.

Similarly, the lights emitted from the light emitting element ED disposed in the second sub-pixel PX2 may be emitted as green light while transmitting through the second wavelength conversion layer WCL2, the capping layer CPL, and the second color filter layer CFL2.

The light emitting element ED disposed in the third sub-pixel PX3 may emit blue light of the third color, and the light may be incident on the light transmitting layer TPL. The third base resin BRS3 of the light transmitting layer TPL may be made of a transparent material, and a part of the light may transmit the third base resin BRS3 and may be incident on the capping layer CPL disposed thereon. The lights incident on the capping layer CPL may be incident on the third color filter layer CFL3 while transmitting the capping layer CPL made of a transparent material, and the third color filter layer CFL3 may block the transmission of lights other than blue light. Accordingly, the third sub-pixel PX3 may emit the blue light.

Further, in accordance with one embodiment, the plurality of color filter layers CFL1, CFL2, and CFL3 may be arranged in the emission area EMA of each sub-pixel PXn. For example, two of each of the color filter layers CFL1, CFL2, and CFL3 may be arranged in an island shape in one sub-pixel PXn. As described above, the first light blocking member UBM may be disposed in the emission area EMA except the area where the first portion RP1 is disposed, and the color filter layers CFL1, CFL2, and CFL3 may be arranged to correspond to the first portion RP1 of the first type electrode RME #1 disposed thereunder or the light emitting element groups ED #1 and ED #2. In the embodiment in which one first type electrode RME #1 includes two first portions RP1, each sub-pixel PXn may include the first light emitting element group ED #1 and the second light emitting element group ED #2 arranged adjacent to each other on the first portion RP1 of the first type electrode RME #1. Each of the plurality of color filter layers CFL1, CFL2, and CFL3 arranged in one sub-pixel PXn may be located to overlap the first light emitting element group ED #1 and the second light emitting element group ED #2. The first light blocking member UBM may be disposed on the second portion RP2 located between the first light emitting element group ED #1 and the second light emitting element group ED #2, and the portion of the second type electrode RME #2 facing the second portion RP2. In the display device 10, the light transmitting area TA where light is emitted and the color filter layers CFL1, CFL2, and CFL3 may be formed to correspond to the structure of the first type electrode RME #1 and the arrangement of the light emitting element groups ED #1 and ED #2.

On the other hand, although not shown in FIG. 23, at least one layer may be further disposed on the color filter layers CFL1, CFL2, and CFL3 and the first light blocking member UBM. The layer disposed on the color filter layers CFL1, CFL2, and CFL3 and the first light blocking member UBM may be a capping layer or an encapsulation layer that protects the members, and the capping layer or the encapsulation layer may have a structure in which inorganic layers are stacked, or inorganic and organic layers are stacked. However, the present disclosure is not limited thereto.

Figure 25:
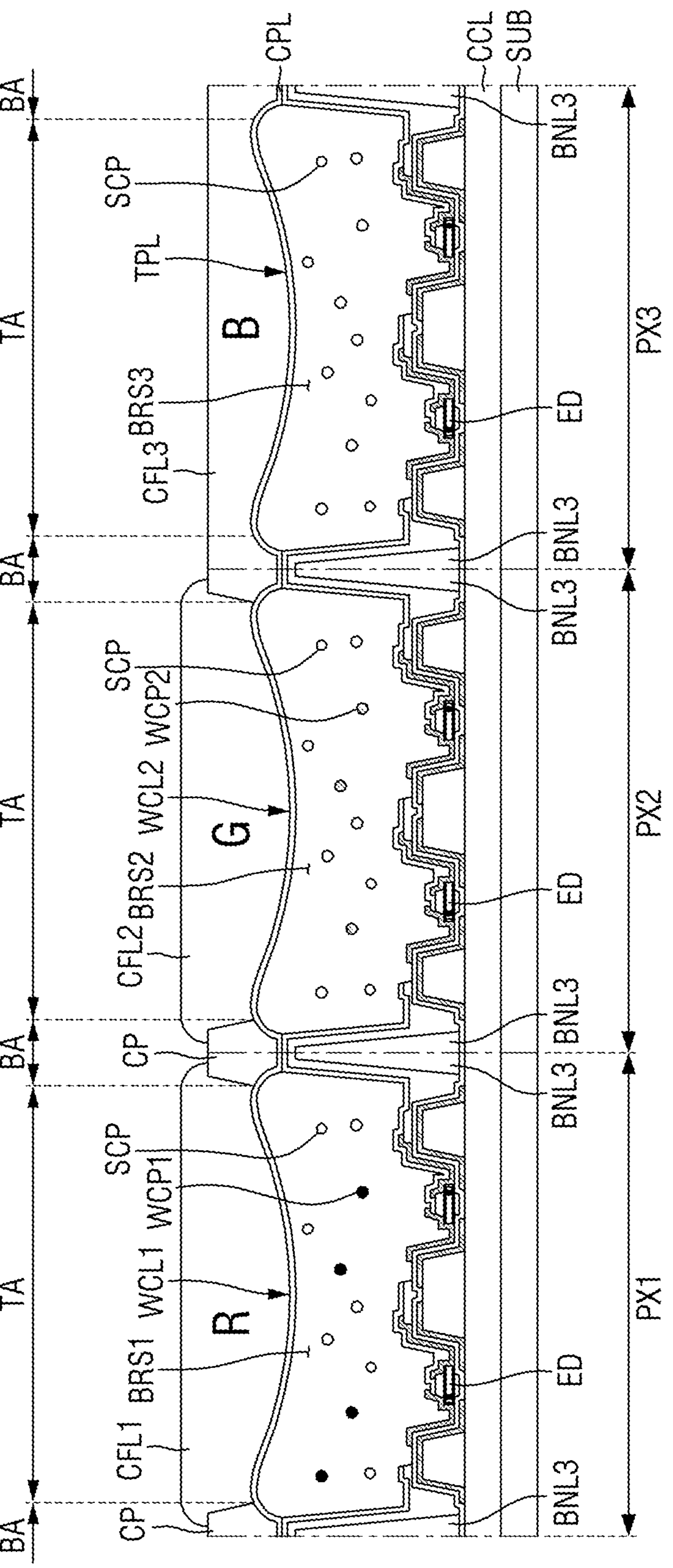
FIG. 25 is a schematic cross-sectional view showing a color control structure and a color filter layer arranged in one pixel of a display device according to an embodiment.

FIG. 25 is a schematic cross-sectional view showing a color control structure and a color filter layer arranged in one pixel of a display device according to an embodiment.

Referring to FIG. 25, in a display device 10 according to one embodiment, the first light blocking member UBM may be omitted and a color pattern CP may be disposed on the third bank BNL3. The described embodiment is different from the embodiment of FIG. 23 and FIG. 24 in that the first light blocking member UBM is replaced with the color pattern CP.

The color pattern CP may be formed in a grid pattern that is substantially the same as that of the first light blocking member UBM of FIG. 21. However, the color pattern CP may be made of the same material as the third color filter layer CFL3 and formed integrally with the third color filter layer CFL3. The material of the third color filter layer CFL3 may be formed with a substantially larger width on the third bank BNL3 in the light blocking area BA of the third sub-pixel PX3.

At least one of the first color filter layer CFL1 and the second color filter layer CFL2 may be partially disposed on the color pattern CP in the light blocking area BA adjacent to the light transmitting area TA of the first sub-pixel PX1 and the second sub-pixel PX2. Each of the first color filter layer CFL1 and the second color filter layer CFL2 may contain a dye of a color different from that of the third color filter layer CFL3, so that the transmission of the light may be blocked at the portion where they are stacked. Further, in the embodiment in which the third color filter layer CFL3 contains a blue colorant, the external light or the reflected light that has transmitted through the light transmitting area BA may have a blue wavelength band. The eye color sensibility perceived by user's eyes varies depending on the color of the light. The light in the blue wavelength band may be perceived less sensitively to a user than the light in the green wavelength band and the light in the red wavelength band. Because the first light blocking member UBM is omitted and the color pattern CP is disposed in the light blocking area BA, the transmission of the light may be blocked and the user may perceive the reflected light relatively less sensitively. Also, it is possible to absorb a part of the light from the outside of the display device 10 and reduce the reflected light due to the external light.

Figure 26:
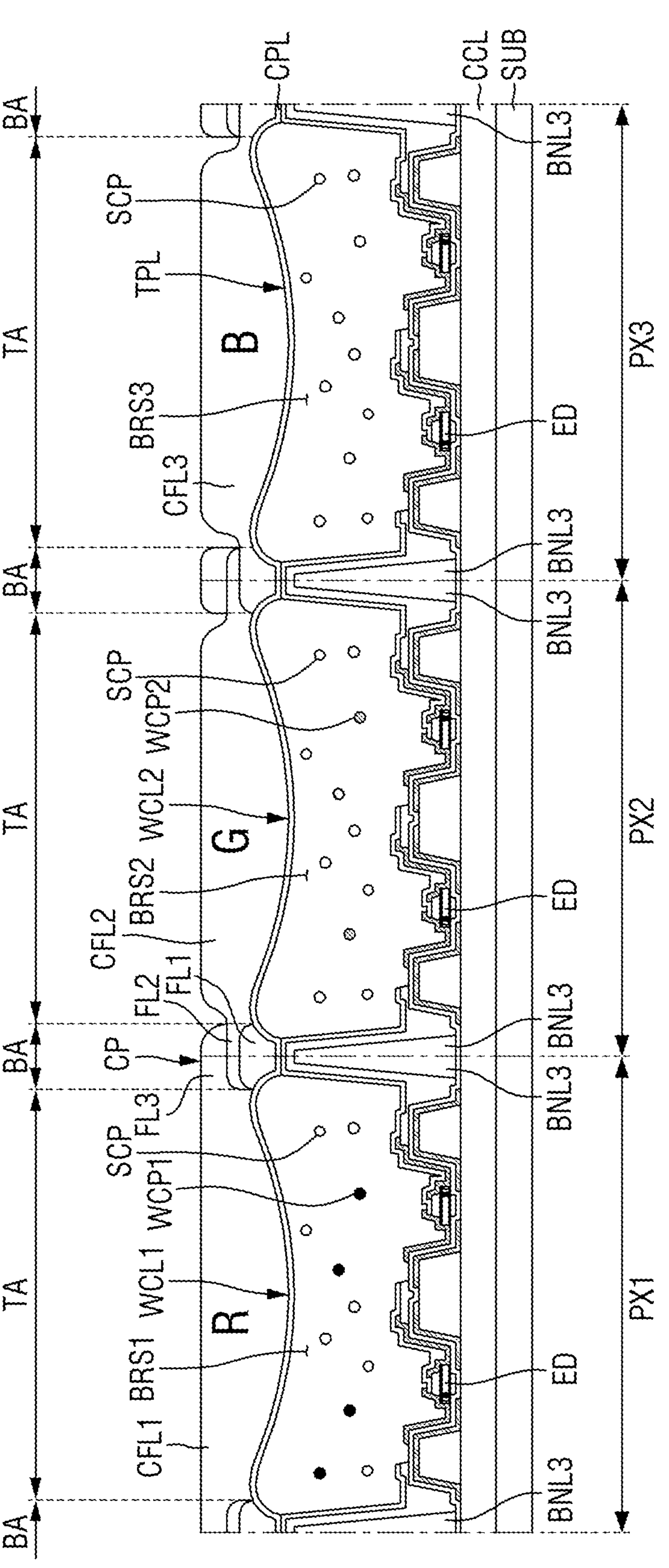
FIG. 26 is a schematic cross-sectional view showing a color control structure and a color filter layer arranged in one pixel of a display device according to an embodiment.

FIG. 26 is a schematic cross-sectional view showing a color control structure and a color filter layer arranged in one pixel of a display device according to an embodiment.

Referring to FIG. 26, in a display device 10 according to one embodiment, the color pattern CP may include a plurality of color layers FL1, FL2, and FL3. The described embodiment is different from the embodiment shown in FIG. 25 in that the color layers FL1, FL2, and FL3 made of the same material as those of the first to third color filter layers CFL1, CFL2, and CFL3 are stacked.

The third color layer FL3 may be made of the same material as that of the third color filter layer CFL3 and disposed in the light blocking area BA. The third color layer FL3 may be disposed directly on the capping layer CPL in the light blocking area BA, and may be integrated with the third color filter layer CFL3 in the light blocking area BA adjacent to the light transmitting area TA of the third sub-pixel PX3.

The second color layer FL2 may be made of the same material as that of the second color filter layer CFL2 and disposed in the light blocking area BA. The second color layer FL2 may be directly disposed on the third color layer FL3 in the light blocking area BA, and may be integrated with the second color filter layer CFL2 in the light blocking area BA adjacent to the light transmitting area TA of the second sub-pixel PX2. Similarly, the first color layer FL1 may be made of the same material as that of the first color filter layer CFL1 and disposed in the light blocking area BA. The first color layer FL1 may be directly disposed on the second color layer FL2 in the light blocking area BA, and may be integrated with the first color filter layer CFL1 in the light blocking area BA adjacent to the light transmitting area TA of the first sub-pixel PX1.

The color pattern CP according to the described embodiment has a structure in which the first to third color layers FL1, FL2, and FL3 are sequentially stacked, so that it is possible to prevent color mixture between adjacent areas due to the materials containing different colorants.

Figure 27:
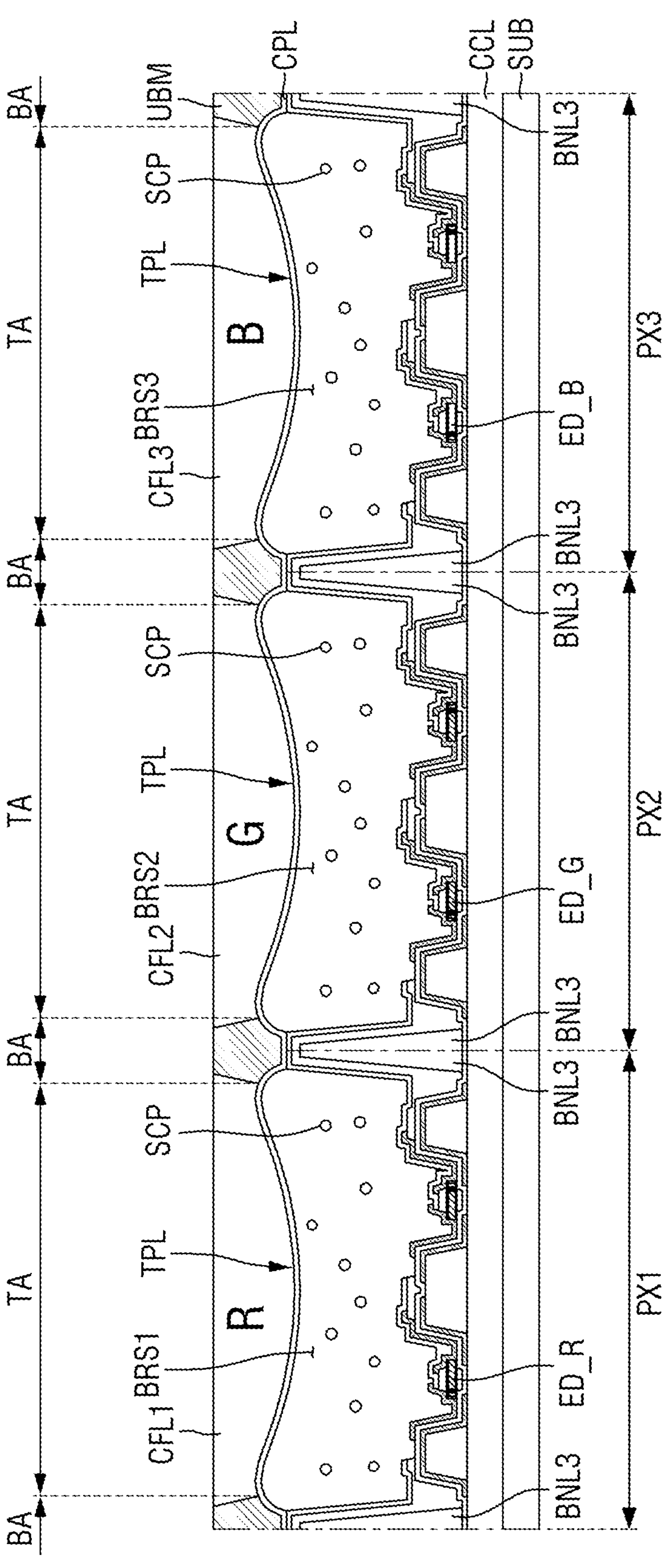
FIG. 27 is a schematic cross-sectional view showing a color control structure and a color filter layer arranged in one pixel of a display device according to an embodiment.

FIG. 27 is a schematic cross-sectional view showing a color control structure and a color filter layer arranged in one pixel of a display device according to still another embodiment.

Referring to FIG. 27, in a display device 10 according to one embodiment, each sub-pixel PXn may include various types of light emitting elements ED (ED_R, ED_G, and ED_B), and only the light transmitting layer TPL may be disposed in each sub-pixel PXn. The lights emitted from the light emitting elements ED_B, ED_G, and ED_R of each sub-pixel PXn may have different colors, and may be emitted through the color filter layers CFL1, CFL2, and CFL3 without color change.

In one embodiment, the light emitting element ED_R that emits red light may be disposed in the first sub-pixel PX1, the light emitting element ED_G that emits green light may be disposed in the second sub-pixel PX2, and the light emitting element ED_B that emits blue light may be disposed in the third sub-pixel PX3. Because the light emitting elements ED_B, ED_G, and ED_R of each sub-pixel PXn emit lights of different colors, each sub-pixel PXn may display the lights of different colors even if only the light transmitting layer TPL is disposed in each sub-pixel PXn.

In concluding the detailed description, those skilled in the art will appreciate that many variations and modifications can be made to the embodiments without substantially departing from the spirit and scope of the present disclosure. Therefore, the embodiments of the present disclosure are used in a generic and descriptive sense only and not for purposes of limitation.

What is claimed is:

1. A display device comprising:

an emission area and a sub-area spaced from the emission area in a first direction;

a plurality of electrodes in the emission area and extending in the first direction, the plurality of electrodes being spaced from each other along a second direction crossing the first direction;

a first insulating layer on the plurality of electrodes; and a plurality of light emitting elements on the first insulating layer, both ends of the plurality of light emitting elements being on the plurality of electrodes that are spaced from each other along the second direction, wherein the plurality of electrodes comprises a first electrode comprising a first portion and a second portion, the second portion of the first electrode having a width measured in the second direction that is smaller than a width of the first portion measured in the second direction, and wherein the width of the first portion measured in the second direction gradually changes along the first direction over an entire length of the first portion, and wherein a first side of the first portion of the first electrode protrudes in the second direction and a second side of the first portion of the first electrode is parallel to the first direction and is colinear with a side of the second portion of the first electrode.

2. The display device of claim 1, wherein the plurality of electrodes further comprises a second electrode spaced from the first electrode in the second direction, a third electrode between the first electrode and the second electrode, and a fourth electrode spaced from the second electrode in the second direction, the fourth electrode comprises a first portion and a second portion, and the first portion of the first electrode and the first portion of the fourth electrode are arranged side by side in the second direction.

3. The display device of claim 2, wherein a distance between the first electrode and the third electrode is equal to a distance between the second electrode and the fourth electrode, and a distance between the first portion of the first electrode and the third electrode is equal to a distance between the second portion of the first electrode and the third electrode.

4. The display device of claim 2, wherein the second electrode and the third electrode have the same width as the second portion of the first electrode.

5. The display device of claim 2, further comprising:

a plurality of first banks overlapping the first electrode and the fourth electrode; and a second bank overlapping the second electrode and the third electrode, wherein a distance between the first banks and the second bank is greater than a distance between the first electrode and the third electrode.

6. The display device of claim 5, wherein the second bank comprises a plurality of first bank portions and a second bank portion having a width measured in the second direction larger than that of the first bank portion, the first bank portion is located at a portion of the third electrode that is facing the first portion of the first electrode, and the second bank portion is located at a portion of the third electrode that is facing the second portion of the first electrode.

7. The display device of claim 1, wherein the plurality of electrodes further comprises a second electrode spaced from the first electrode in the second direction, the second electrode comprising a first portion and a second portion, and both ends of the plurality of light emitting elements are on the first electrode and the second electrode.

8. The display device of claim 1, wherein at least a portion of each of the plurality of electrodes is in the sub-area, and the first insulating layer comprises a plurality of contact portions in the sub-area and exposing a part of a top surface of the plurality of electrodes.

9. The display device of claim 8, further comprising a plurality of contact electrodes on the plurality of electrodes and in contact with some of the light emitting elements, wherein the contact electrodes are in the emission area and the sub-area, and the contact electrodes contact with some of the electrodes through the plurality of contact portions in the sub-area.

10. The display device of claim 1, wherein the first electrode comprises a plurality of first portions spaced from each other in the first direction, and the second portion is located between the plurality of first portions.

11. The display device of claim 10, wherein the plurality of light emitting elements comprises a first light emitting element group having one end on the first portion of the first electrode and a second light emitting element group having one end on other first portion of the first electrode, and wherein the number of the light emitting elements of the first light emitting element group and the second light emitting element group is greater than the number of the light emitting elements having one end on the second portion of the first electrode.

12. The display device of claim 11, further comprising:

a color control structure on the light emitting elements;

a color filter layer on the color control structure; and a first light blocking member on the color control structure and surrounding the color filter layer, wherein the color filter layer overlaps the plurality of first portions of the first electrode, and wherein the first light blocking member comprises a portion overlapping the second portion of the first electrode.

13. A display device comprising:

an emission area and a sub-area spaced from the emission area in a first direction;

a plurality of electrodes in the emission area and extending in the first direction, the plurality of electrodes being spaced from each other along a second direction crossing the first direction;

a first insulating layer on the plurality of electrodes; and a plurality of light emitting elements on the first insulating layer, both ends of the plurality of light emitting elements being on the plurality of electrodes that are spaced from each other along the second direction, wherein the plurality of electrodes comprises a first electrode comprising a first portion and a second portion, the second portion of the first electrode having a width measured in the second direction that is smaller than a width of the first portion measured in the second direction, wherein the plurality of electrodes further comprises a second electrode spaced from the first electrode in the second direction, a third electrode between the first electrode and the second electrode, and a fourth electrode spaced from the second electrode in the second direction, wherein the fourth electrode comprises a first portion and a second portion, wherein the first portion of the first electrode and the first portion of the fourth electrode are arranged side by side in the second direction, and wherein, an inner side of the first portion of the first electrode that is facing the third electrode is aligned in the first direction with an inner side of the second portion of the first electrode that is facing the third electrode.

14. The display device of claim 13, wherein in the first electrode, an outer side of the first portion of the first electrode protrudes from an outer side of the second portion of the first electrode in the second direction.

* * * * *